United States Patent
Chung et al.

(10) Patent No.: US 11,417,766 B2
(45) Date of Patent: Aug. 16, 2022

(54) TRANSISTORS HAVING NANOSTRUCTURES

(71) Applicant: Taiwan Semiconductor Manufacturing Co., Ltd., Hsinchu (TW)

(72) Inventors: Cheng-Ting Chung, Hsinchu (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/023,125

(22) Filed: Sep. 16, 2020

(65) Prior Publication Data

US 2021/0328059 A1    Oct. 21, 2021

Related U.S. Application Data

(60) Provisional application No. 63/013,354, filed on Apr. 21, 2020.

(51) Int. Cl.
*H01L 29/66* (2006.01)
*H01L 29/423* (2006.01)
(Continued)

(52) U.S. Cl.
CPC .. *H01L 29/7855* (2013.01); *H01L 21/823431* (2013.01); *H01L 29/0673* (2013.01); *H01L 29/1033* (2013.01); *H01L 29/42392* (2013.01); *H01L 29/66439* (2013.01); *H01L 29/66545* (2013.01); *H01L 29/66818* (2013.01); *H01L 29/775* (2013.01); *H01L 29/78696* (2013.01);
(Continued)

(58) Field of Classification Search
CPC ........... H01L 29/7855; H01L 29/66818; H01L 29/42392; H01L 29/1033; H01L 21/823431; H01L 2029/7858; H01L 29/0673; H01L 29/66439; H01L 29/66545; H01L 29/775; H01L 29/78696
See application file for complete search history.

(56) References Cited

U.S. PATENT DOCUMENTS 9,818,872 B2    11/2017 Ching et al.
9,853,150 B1 *  12/2017 Colinge ............ H01L 29/40111
(Continued)

FOREIGN PATENT DOCUMENTS

KR    20170102701 A    9/2017
KR    20180113118 A    10/2018
(Continued)

*Primary Examiner* — Earl N Taylor
(74) *Attorney, Agent, or Firm* — Haynes and Boone, LLP

(57) ABSTRACT

A semiconductor device according to the present disclosure includes a first transistor and a second transistor. The first transistor includes a plurality of first channel members and a first gate structure wrapping around each of the plurality of first channel members. The second transistor includes a plurality of second channel members and a second gate structure disposed over the plurality of second channel members. Each of the plurality of first channel members has a first width and a first height smaller than the first width. Each of the plurality of second channel members has a second width and a second height greater than the second width.

20 Claims, 27 Drawing Sheets

(51) Int. Cl.
*H01L 29/786* (2006.01)
*H01L 29/775* (2006.01)
*H01L 29/78* (2006.01)
*H01L 29/10* (2006.01)
*H01L 21/8234* (2006.01)
*H01L 29/06* (2006.01)
*H01L 29/04* (2006.01)

(52) U.S. Cl.
CPC .... *H01L 29/045* (2013.01); *H01L 2029/7858* (2013.01)

(56) References Cited

U.S. PATENT DOCUMENTS

| | | | |
|---|---|---|---|
| 9,887,269 | B2 | 2/2018 | Ching et al. |
| 9,899,398 | B1 | 2/2018 | Colinge et al. |
| 10,032,627 | B2 | 7/2018 | Lee et al. |
| 10,109,721 | B2 | 10/2018 | Lin et al. |
| 10,157,799 | B2 | 12/2018 | Ching et al. |
| 10,199,502 | B2 | 2/2019 | Huang et al. |
| 10,290,546 | B2 | 5/2019 | Chiang et al. |
| 10,475,902 | B2 | 11/2019 | Lee et al. |
| 10,910,375 | B2* | 2/2021 | Ching ................. H01L 21/3086 |
| 10,943,833 | B2* | 3/2021 | Chiang ................. B82Y 10/00 |
| 11,031,395 | B2* | 6/2021 | Ohtou ............... H01L 29/42392 |
| 2014/0091279 | A1* | 4/2014 | Kachian ............ H01L 29/42392 257/27 |
| 2016/0027929 | A1* | 1/2016 | Cheng ............... H01L 29/78696 257/9 |
| 2017/0141188 | A1* | 5/2017 | Lee ................... H01L 29/42392 |
| 2017/0278842 | A1 | 9/2017 | Song et al. |
| 2017/0373163 | A1* | 12/2017 | Vellianitis ......... H01L 29/78696 |
| 2018/0033797 | A1* | 2/2018 | Colinge ............. H01L 29/78654 |
| 2018/0151452 | A1* | 5/2018 | Doorn .............. H01L 29/66469 |
| 2018/0175036 | A1 | 6/2018 | Ching et al. |
| 2018/0374926 | A1* | 12/2018 | Lee .................... H01L 29/4983 |
| 2020/0020689 | A1* | 1/2020 | Ohtou ............... H01L 21/02532 |
| 2020/0043926 | A1* | 2/2020 | Ohtou ............. H01L 21/823828 |
| 2020/0098756 | A1* | 3/2020 | Lilak ................. H01L 29/66545 |
| 2020/0105755 | A1* | 4/2020 | Cea ..................... H01L 29/7842 |
| 2020/0127119 | A1* | 4/2020 | Lin .................... H01L 29/42392 |
| 2020/0135729 | A1* | 4/2020 | Ng .................... H01L 29/42392 |
| 2021/0057544 | A1* | 2/2021 | Lin .................... H01L 29/66439 |
| 2021/0098302 | A1* | 4/2021 | Ju .................... H01L 21/823412 |
| 2021/0296317 | A1* | 9/2021 | Ohtou .............. H01L 29/78696 |

FOREIGN PATENT DOCUMENTS

| | | |
|---|---|---|
| KR | 20190028061 A | 3/2019 |
| KR | 20190030029 A | 3/2019 |
| KR | 20060037561 A | 4/2020 |
| KR | 20200035896 A | 4/2020 |

* cited by examiner

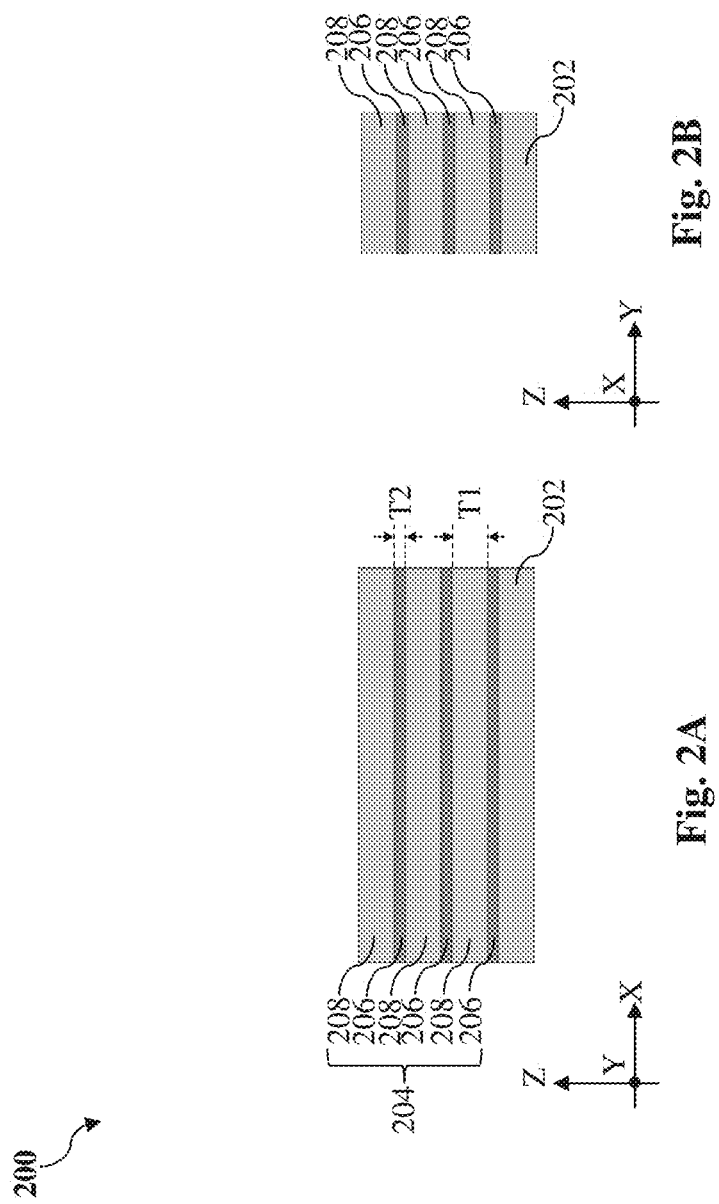

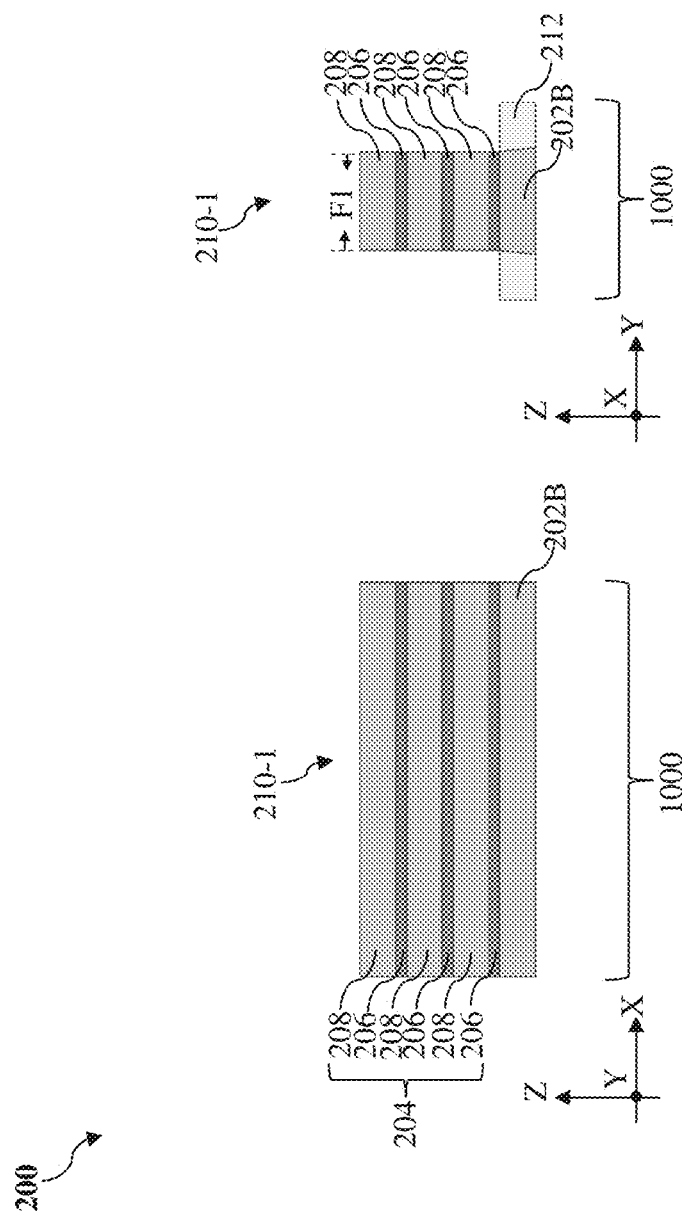

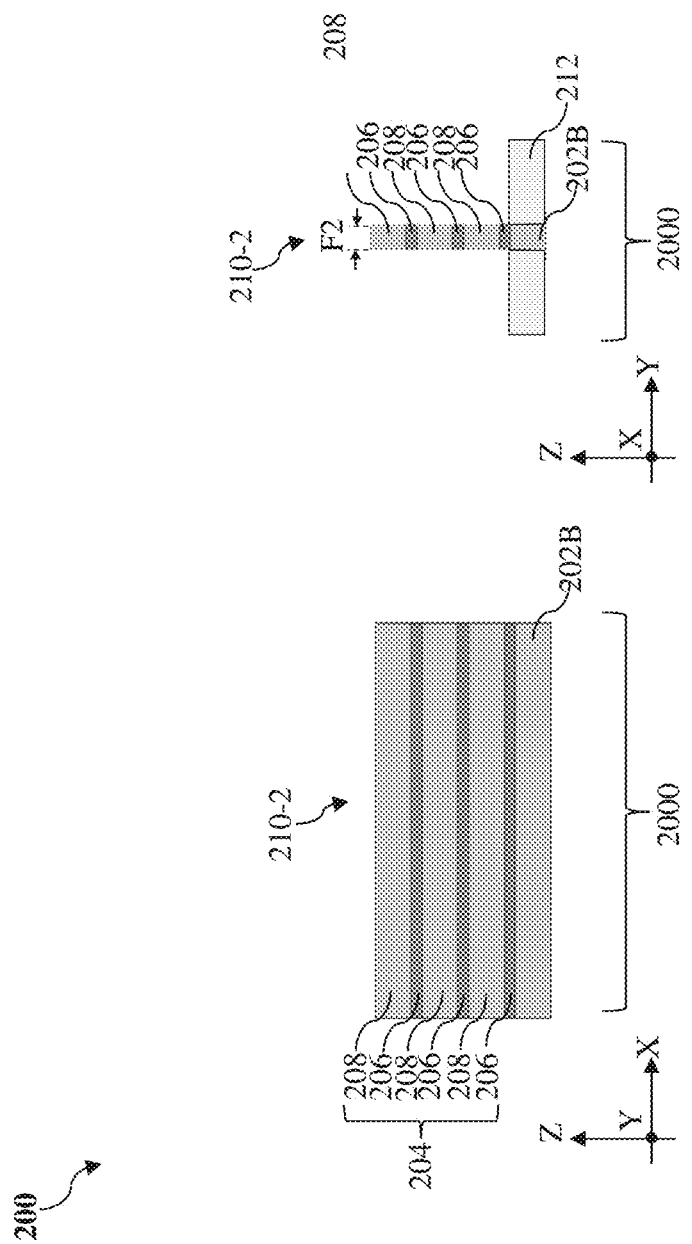

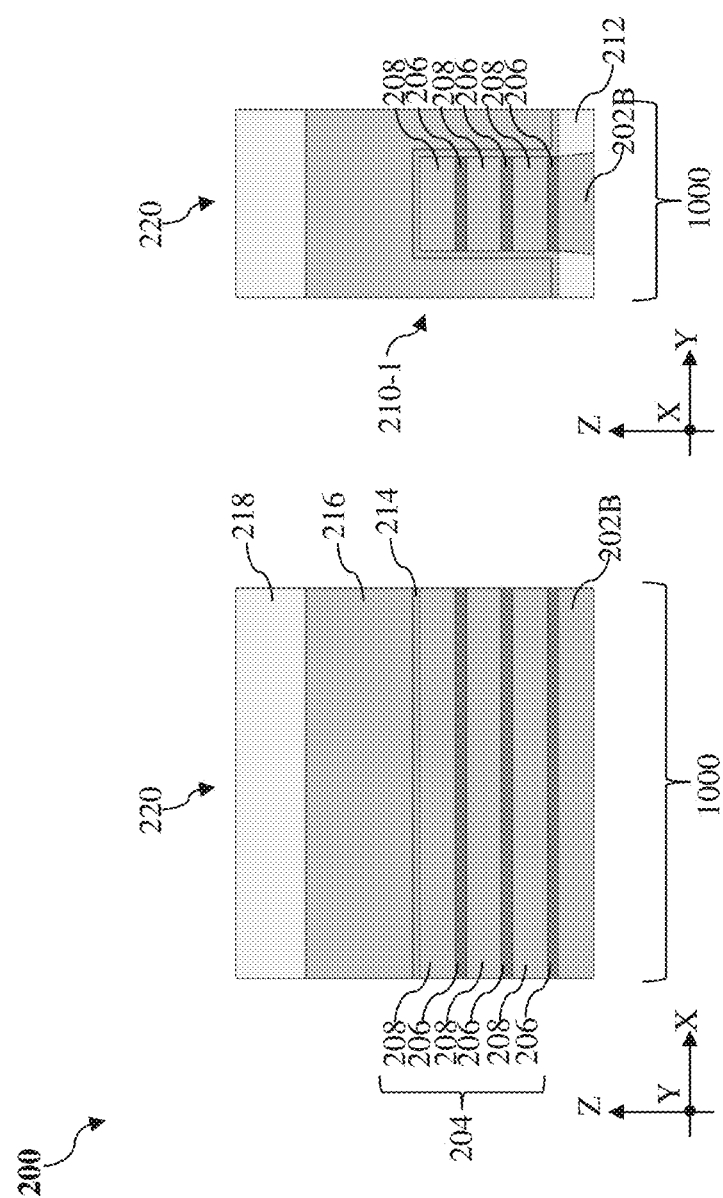

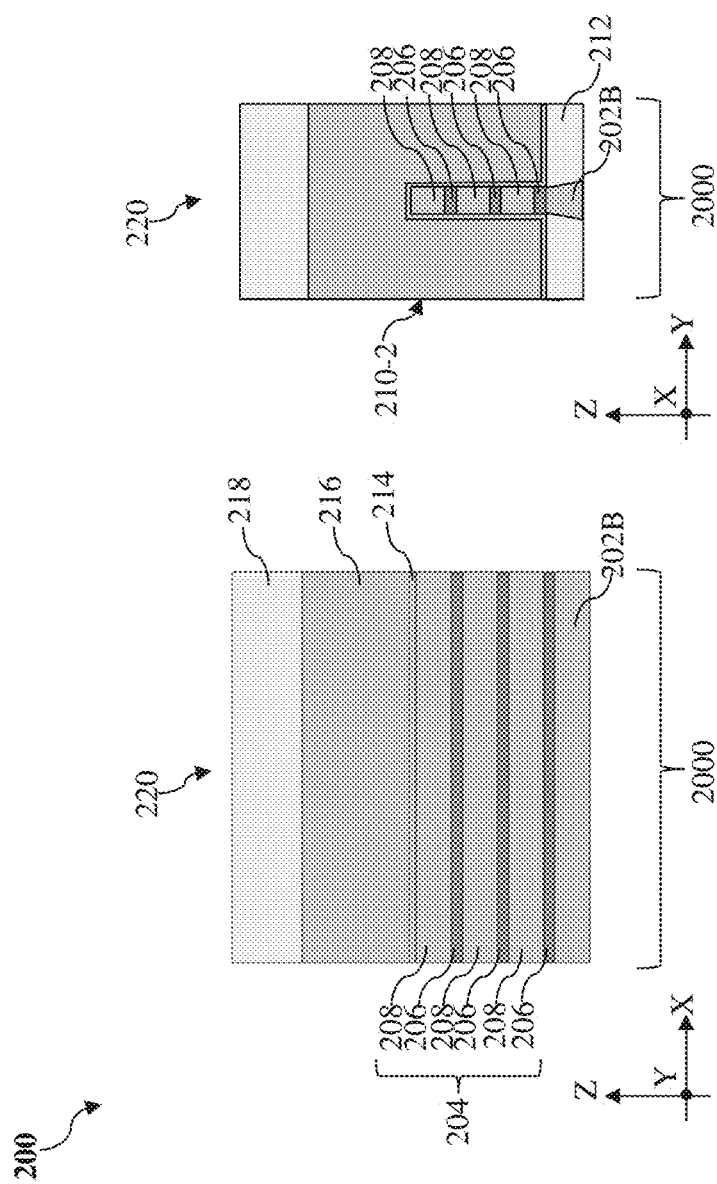

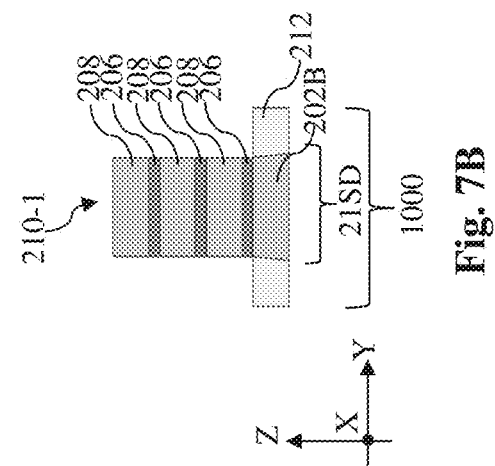
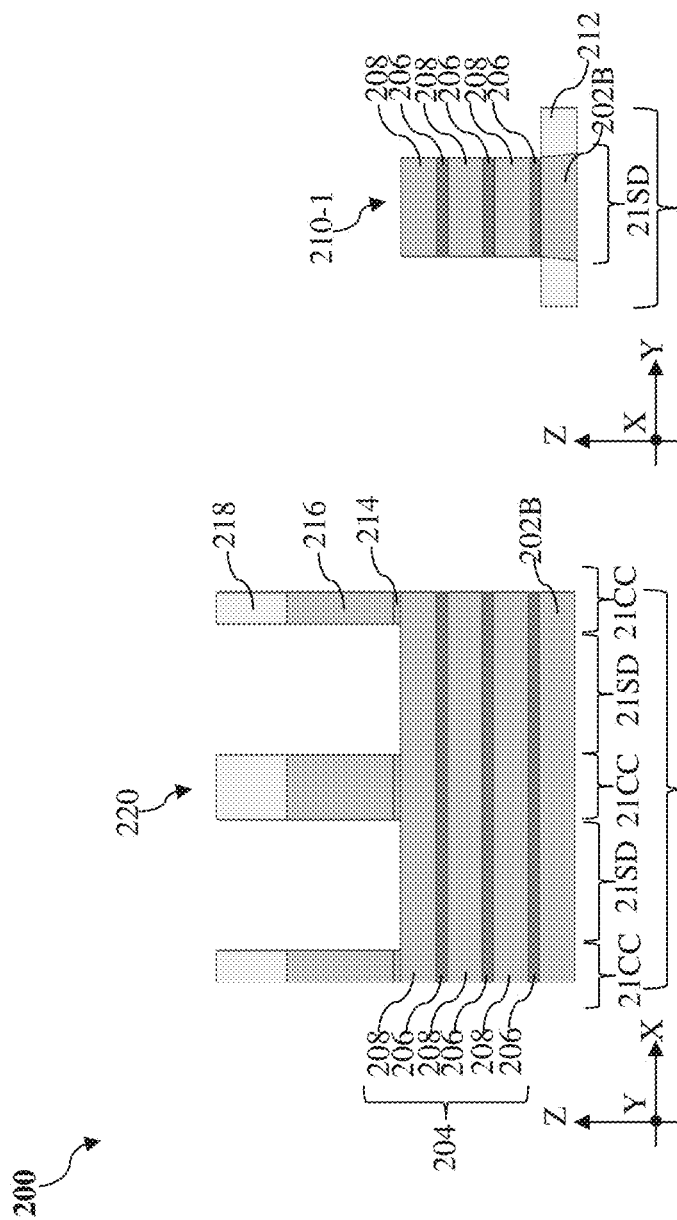

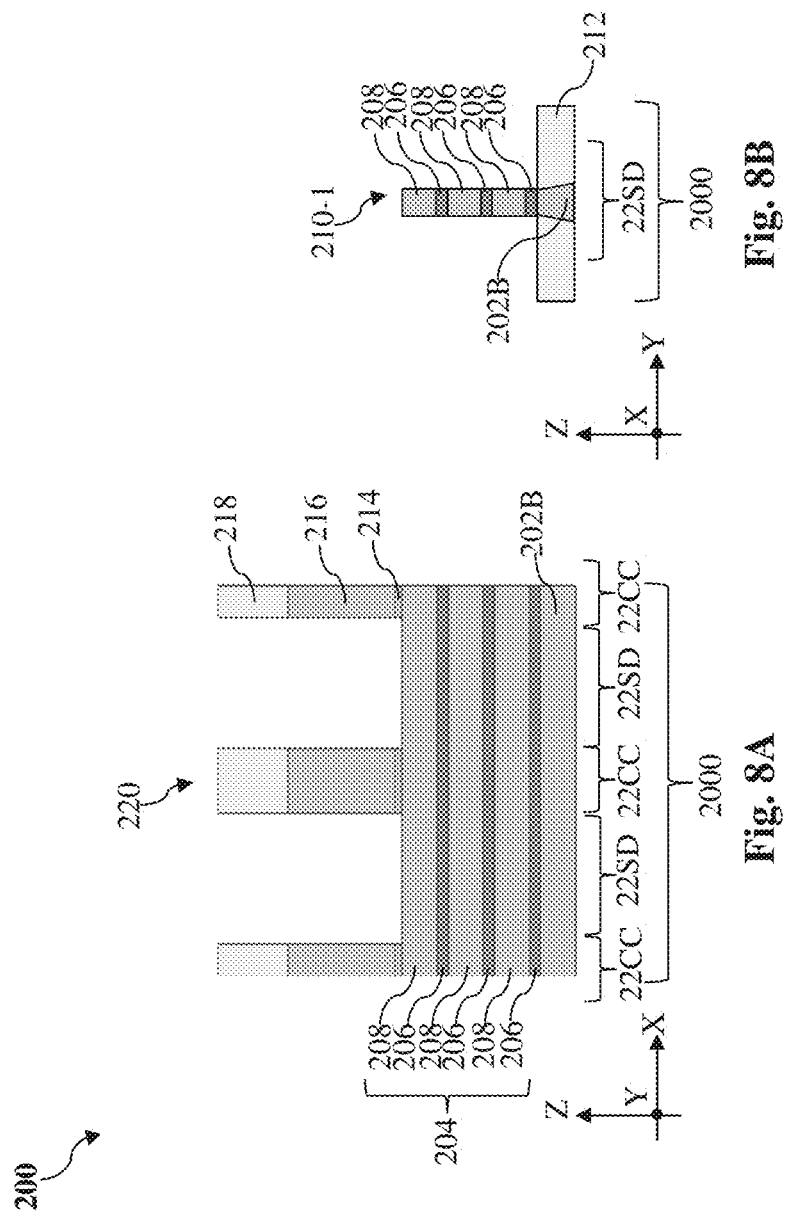

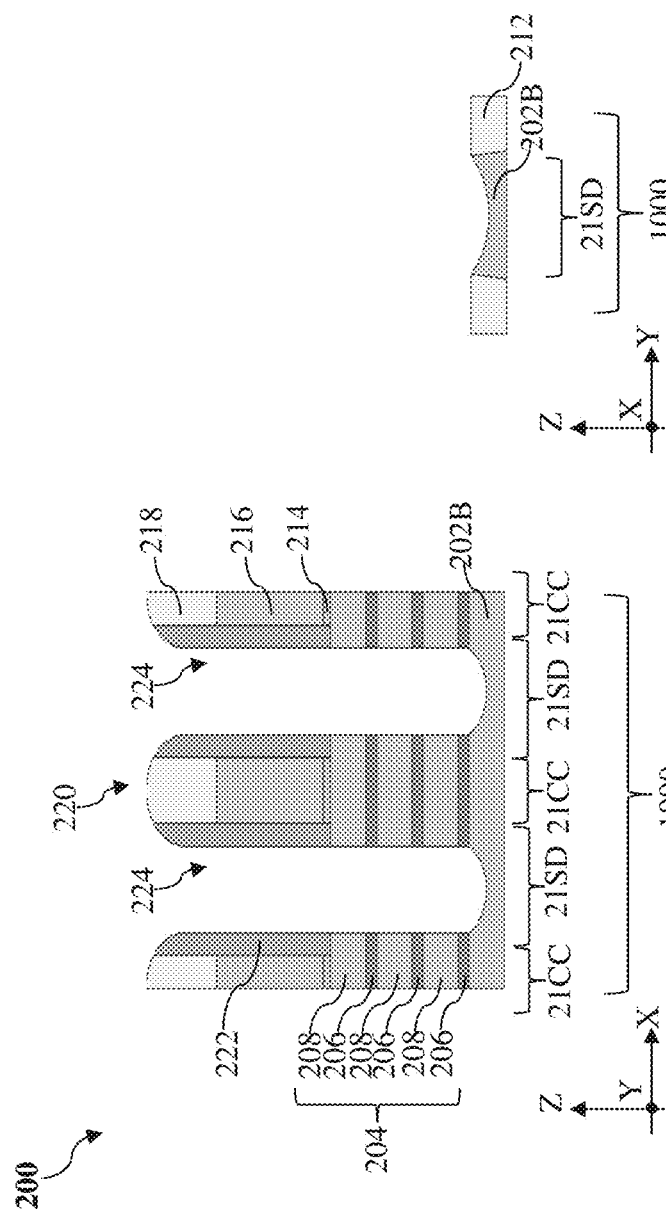
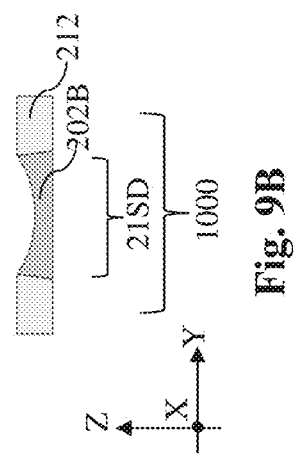
Fig. 9A
Fig. 9B

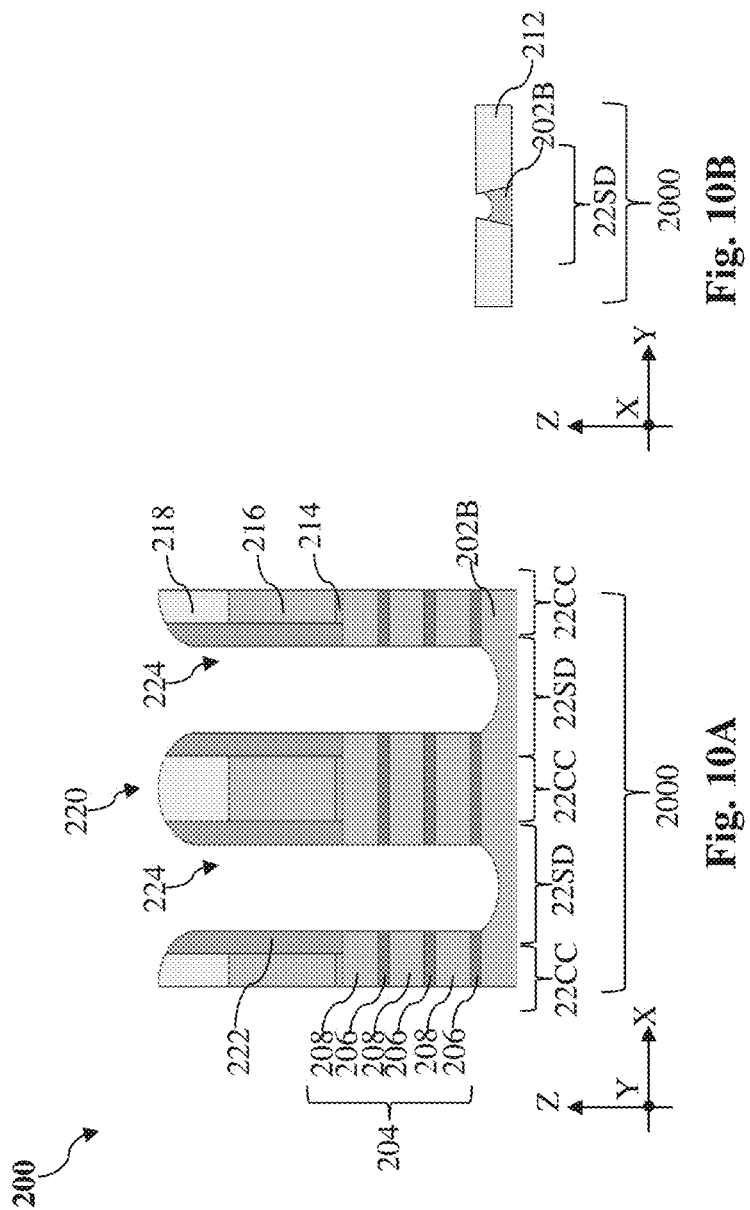

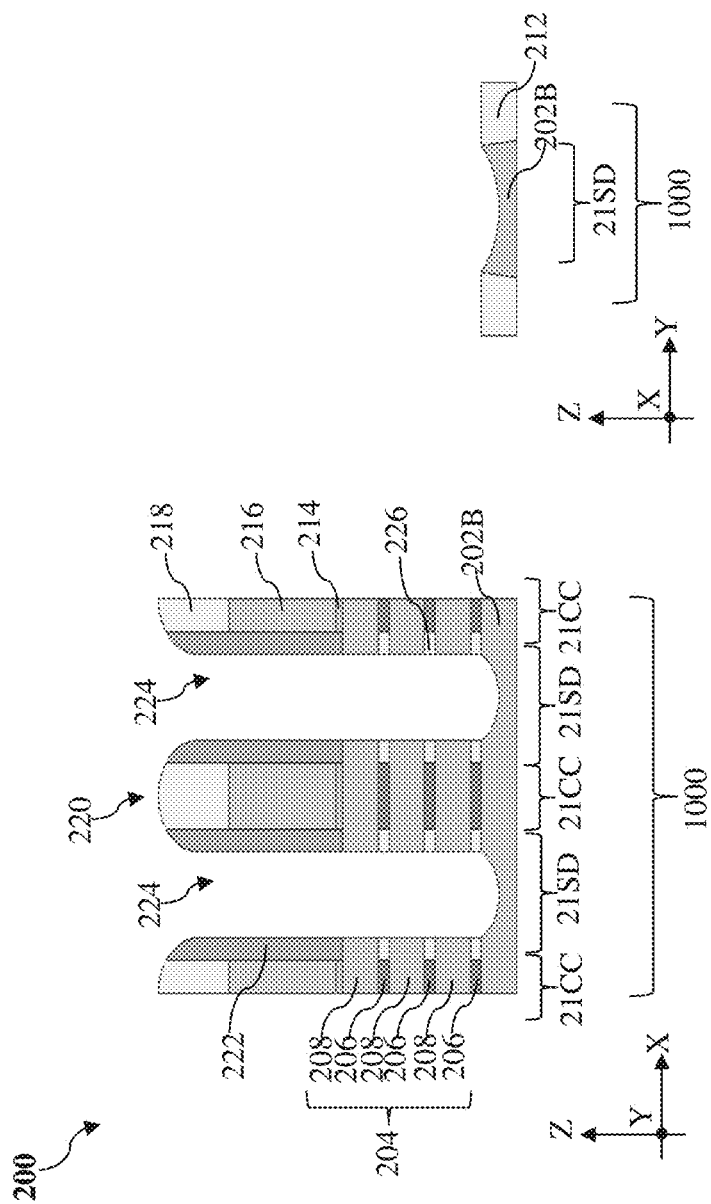

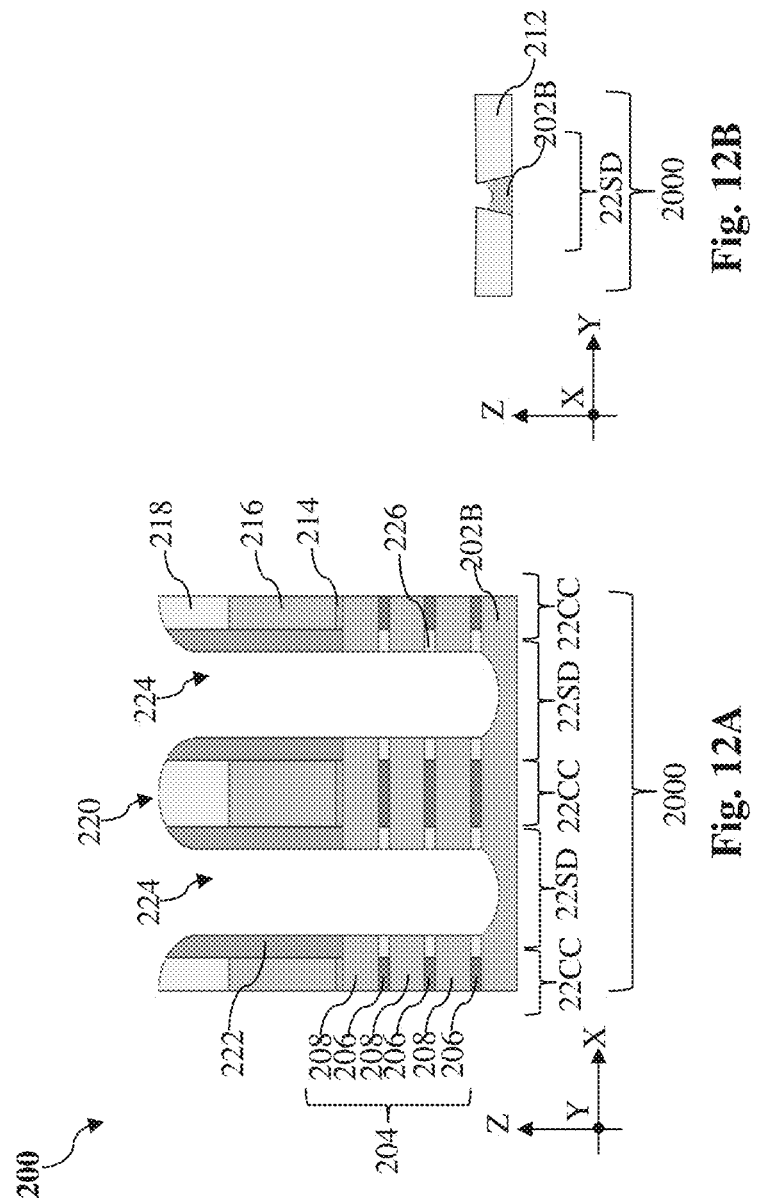

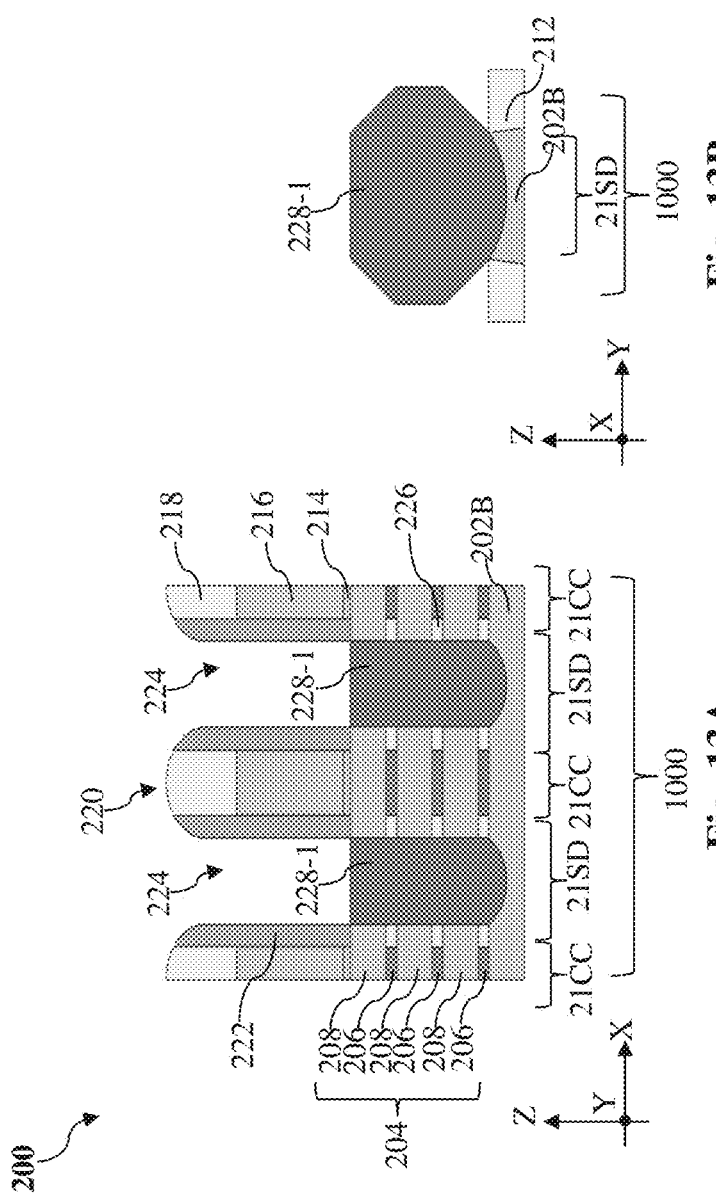

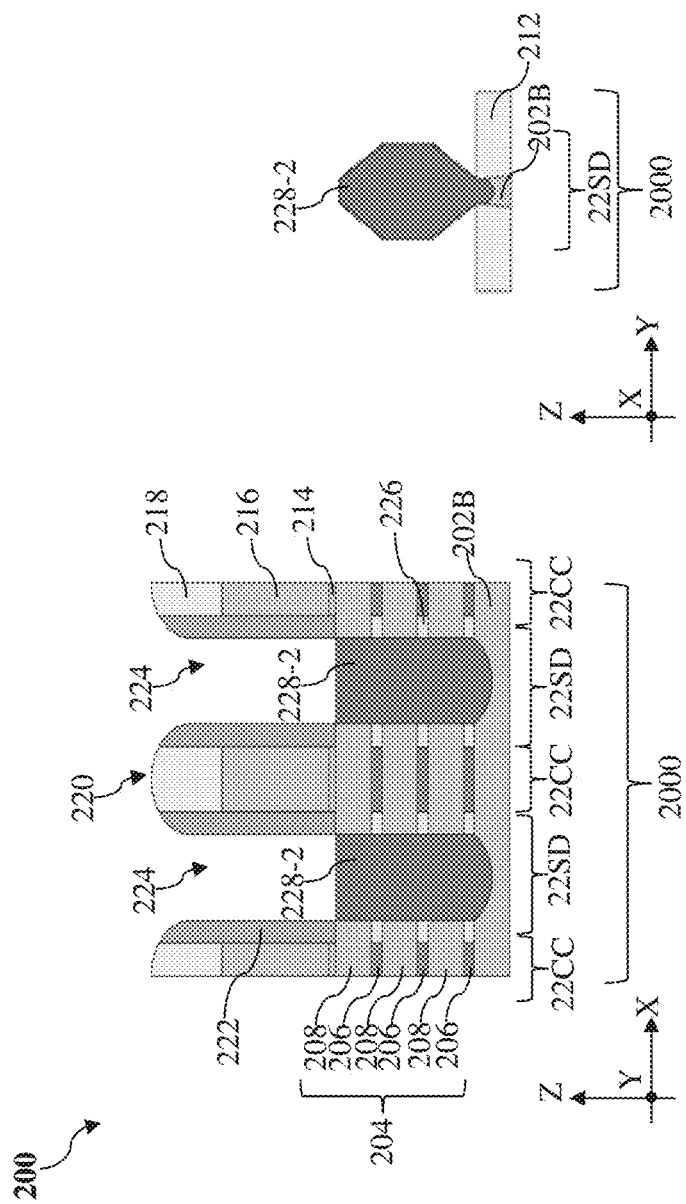

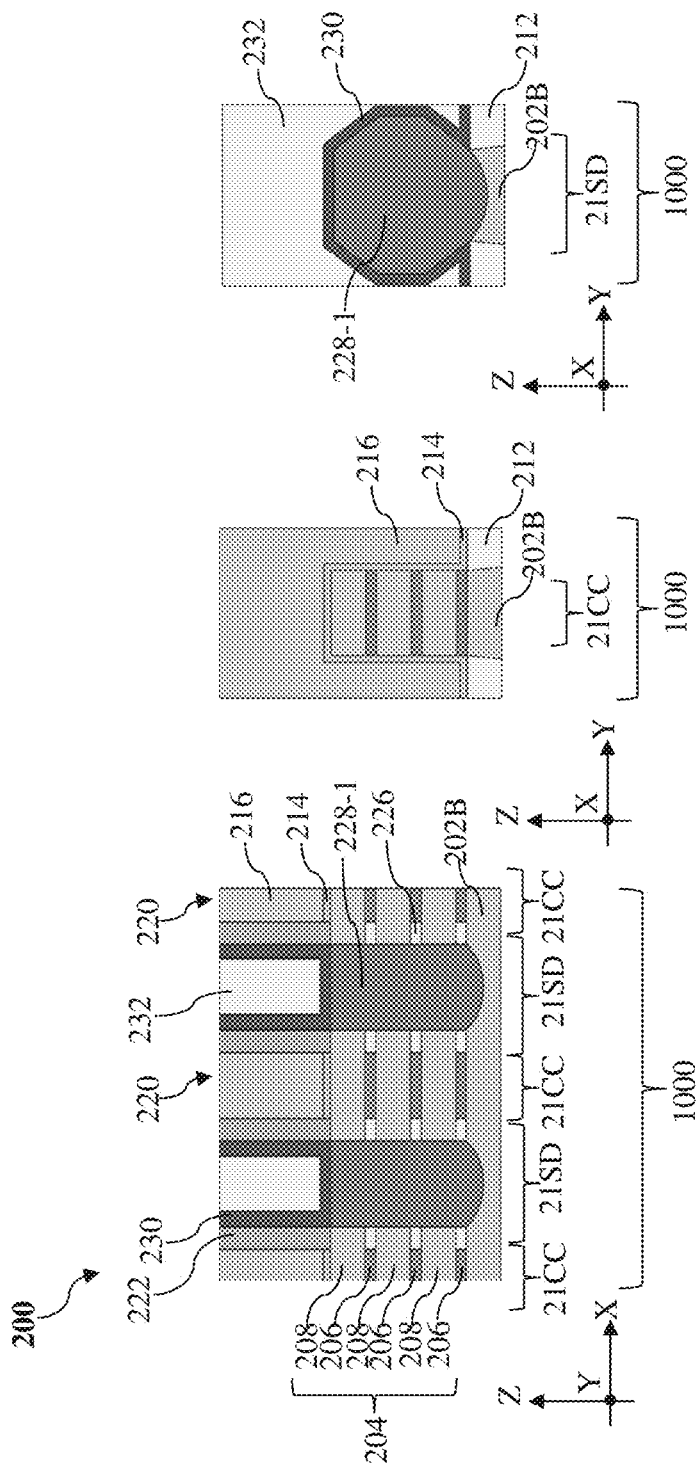

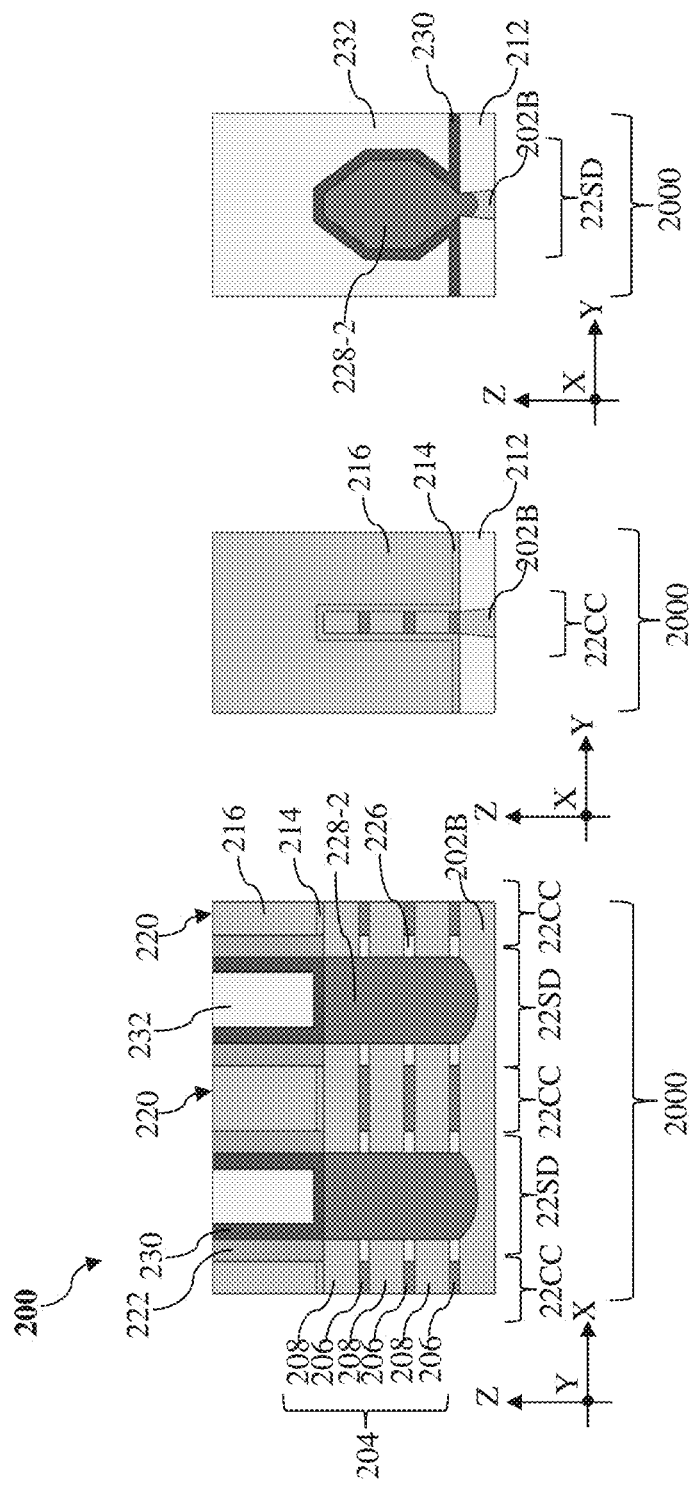

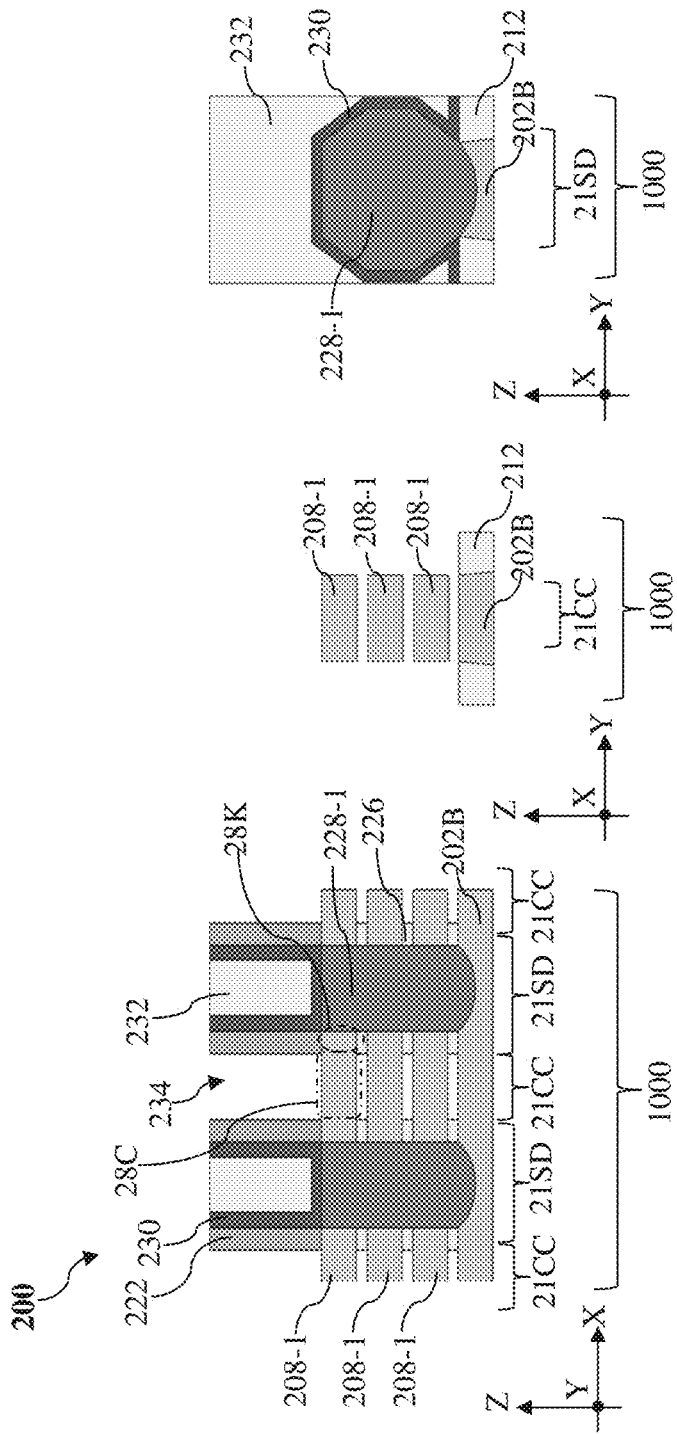

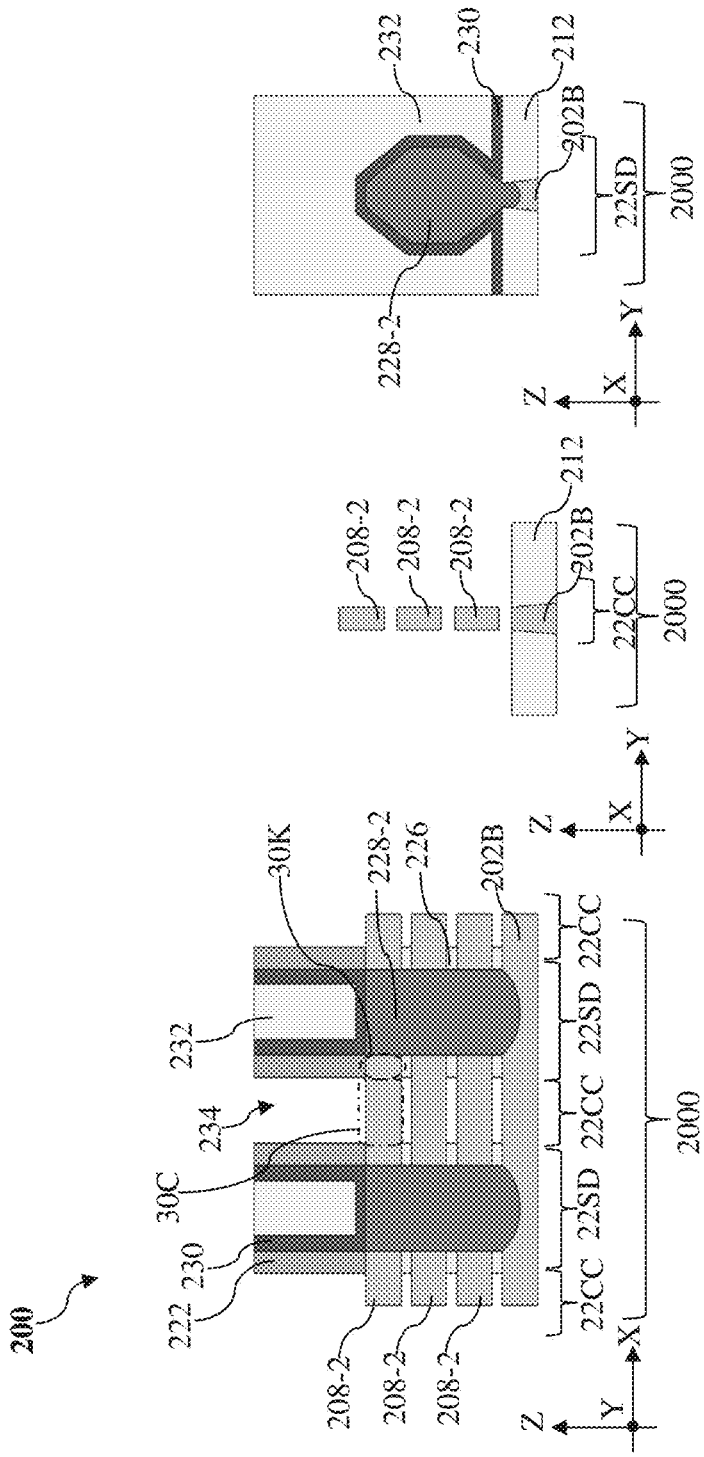

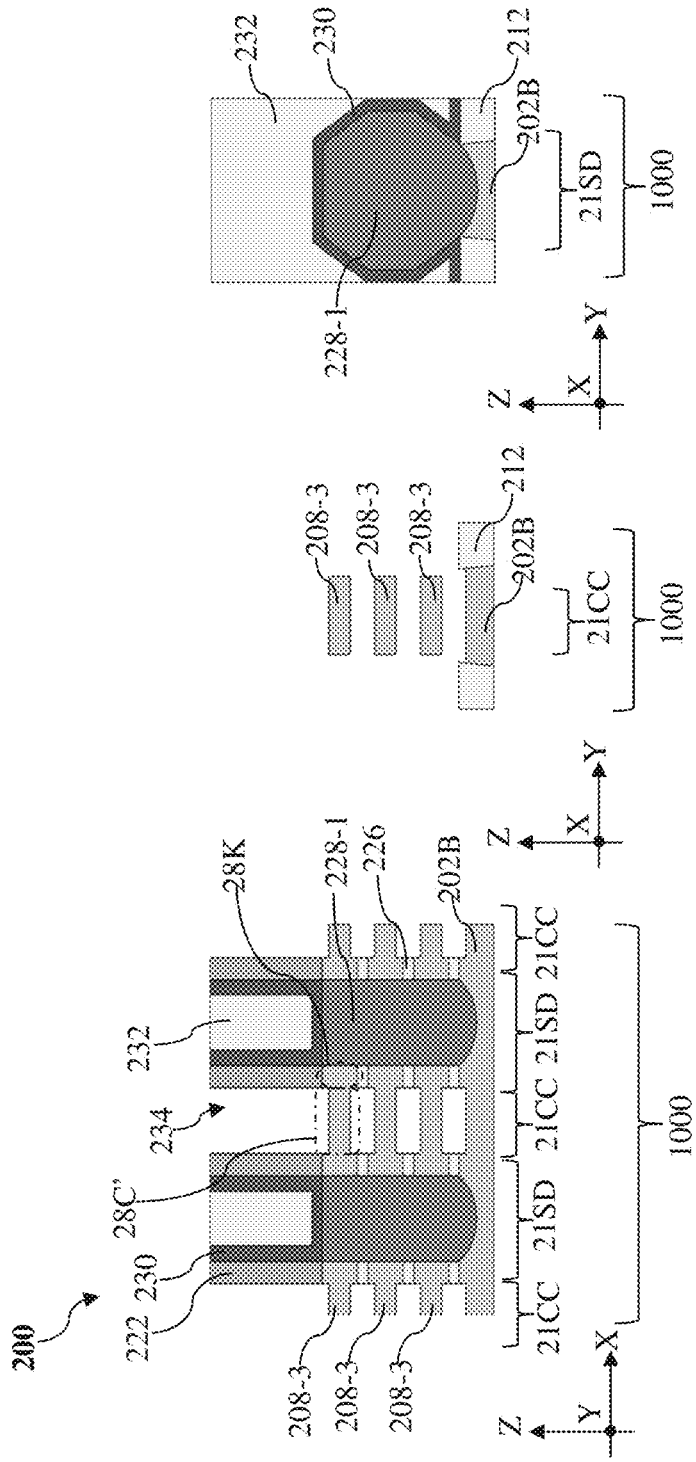

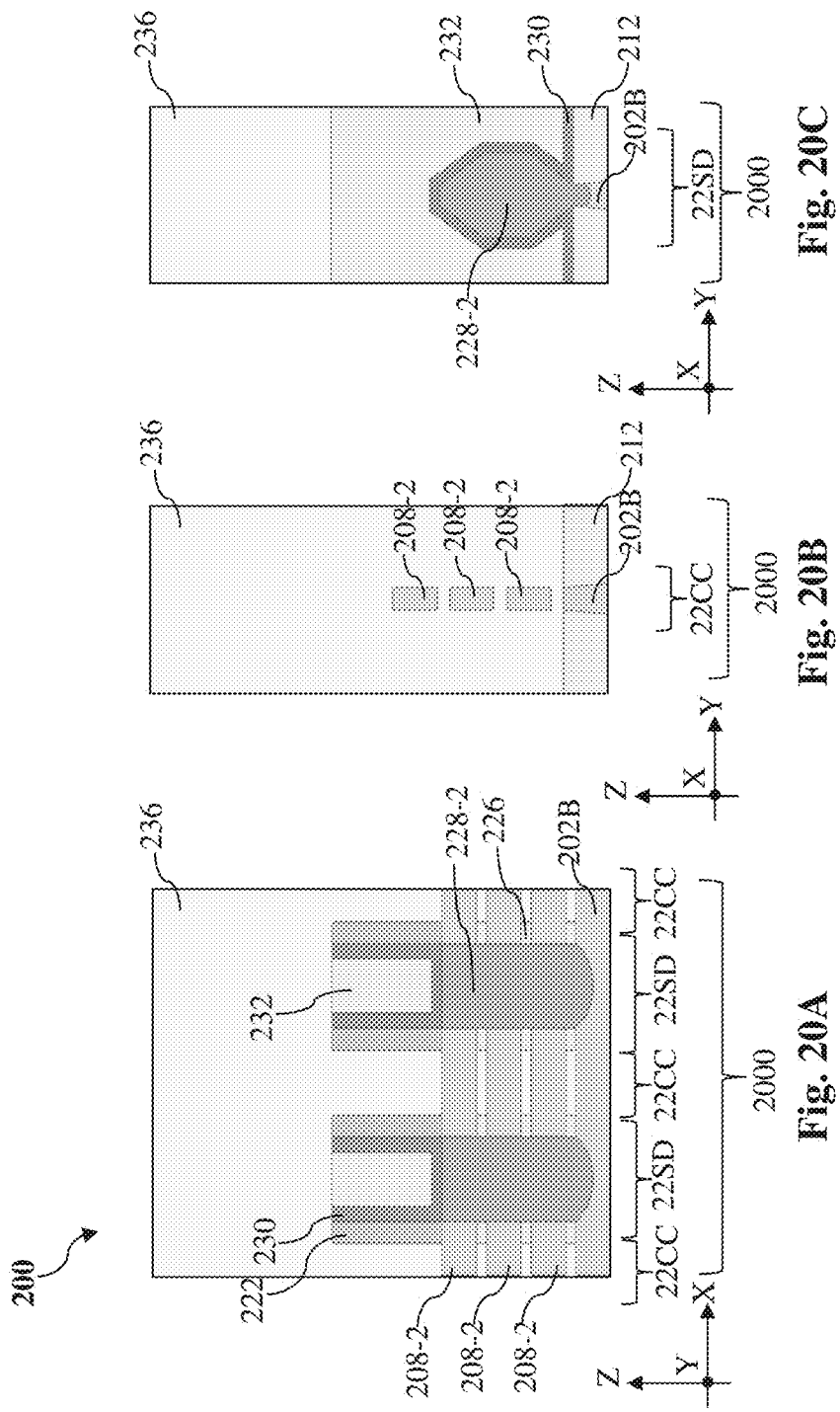

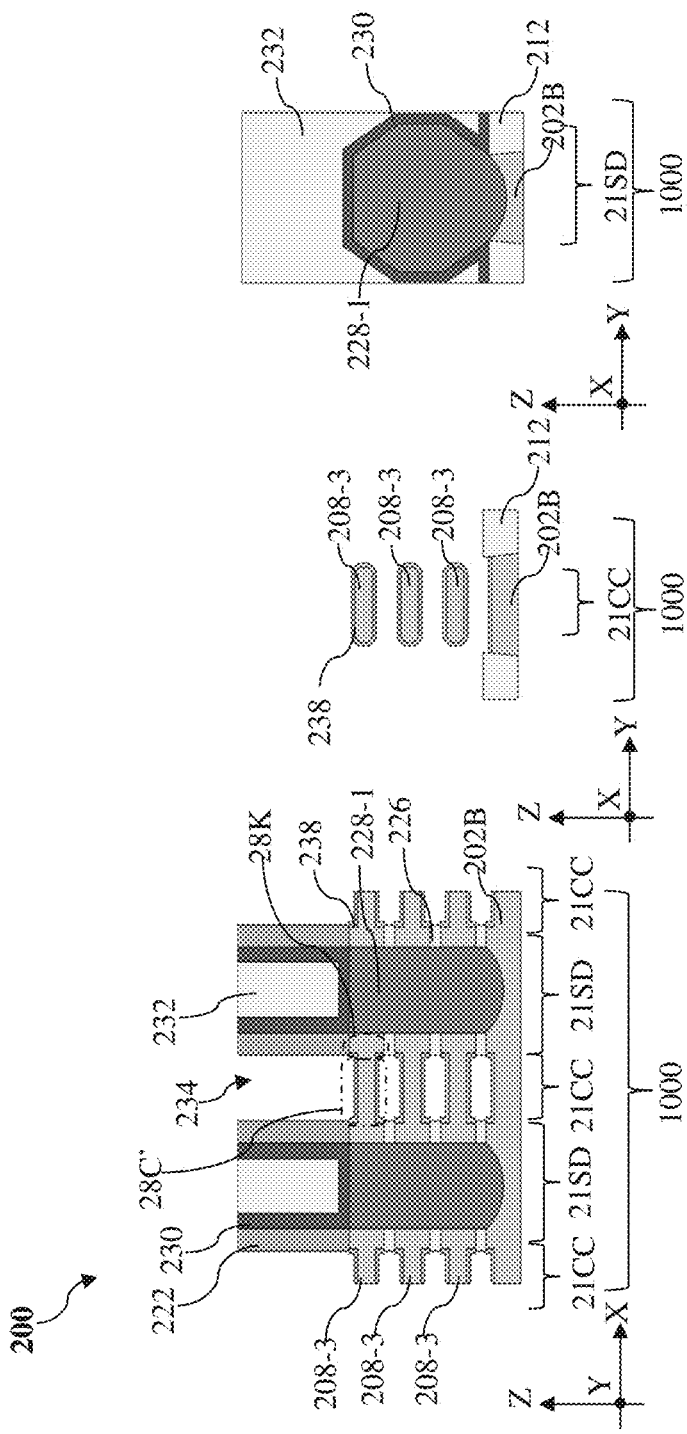

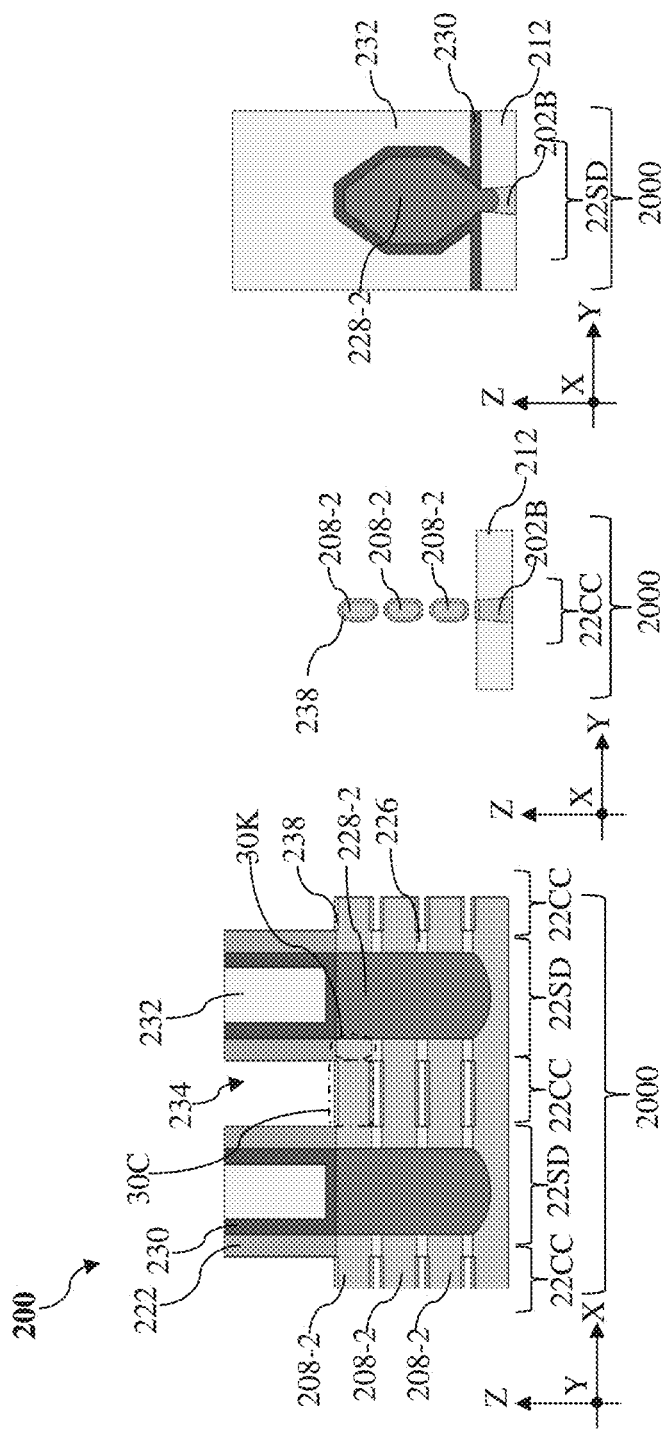

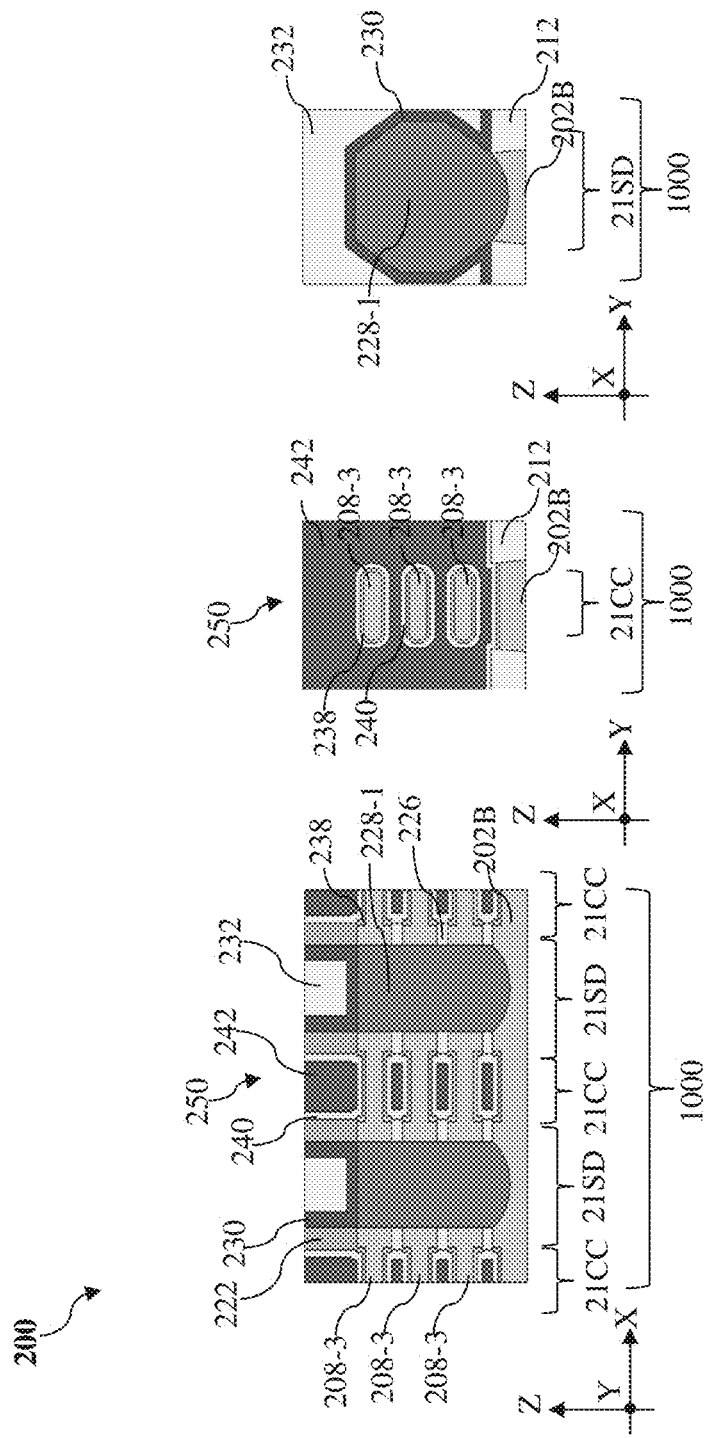

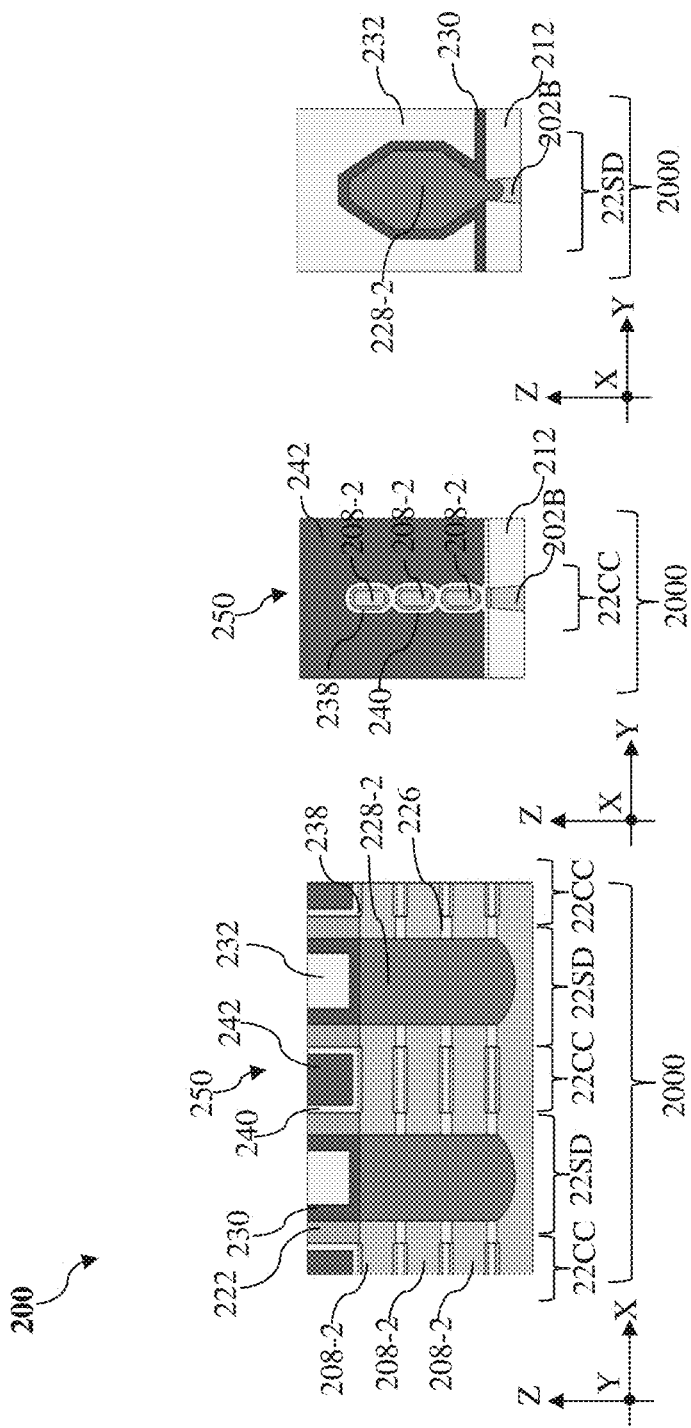

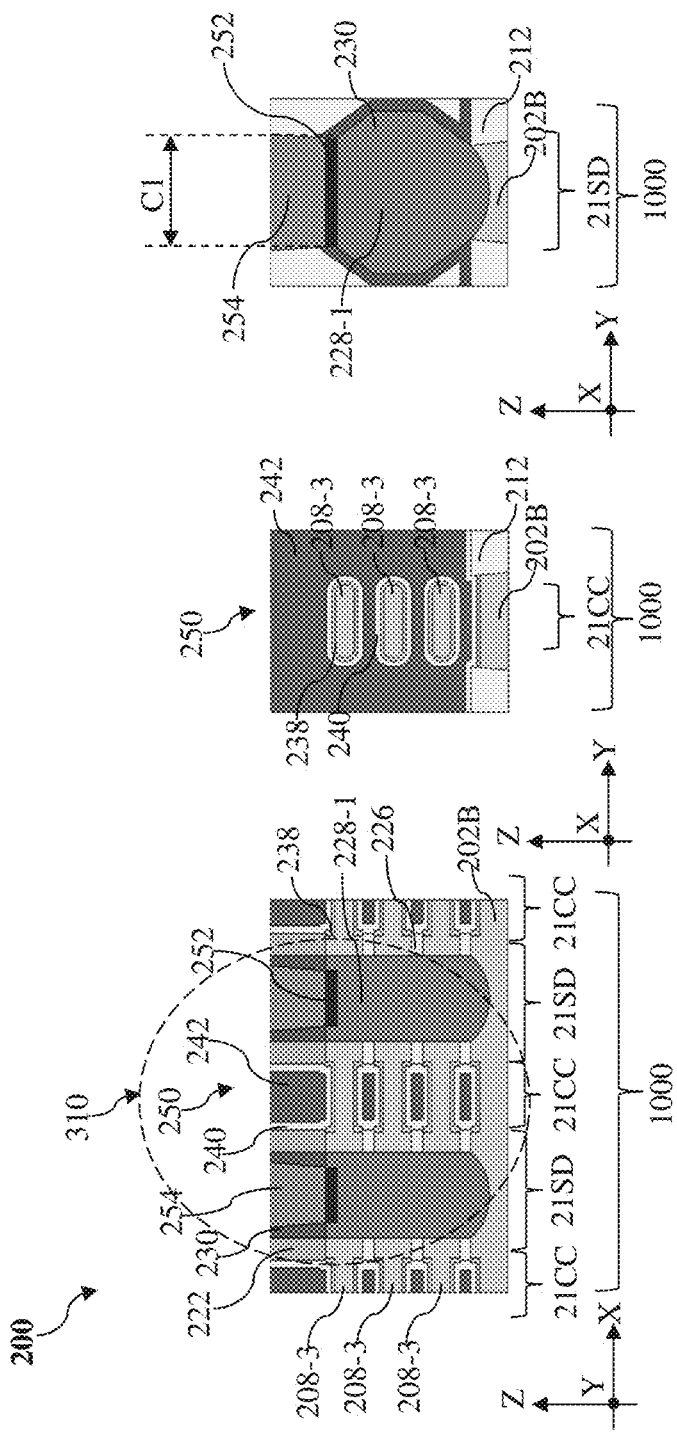

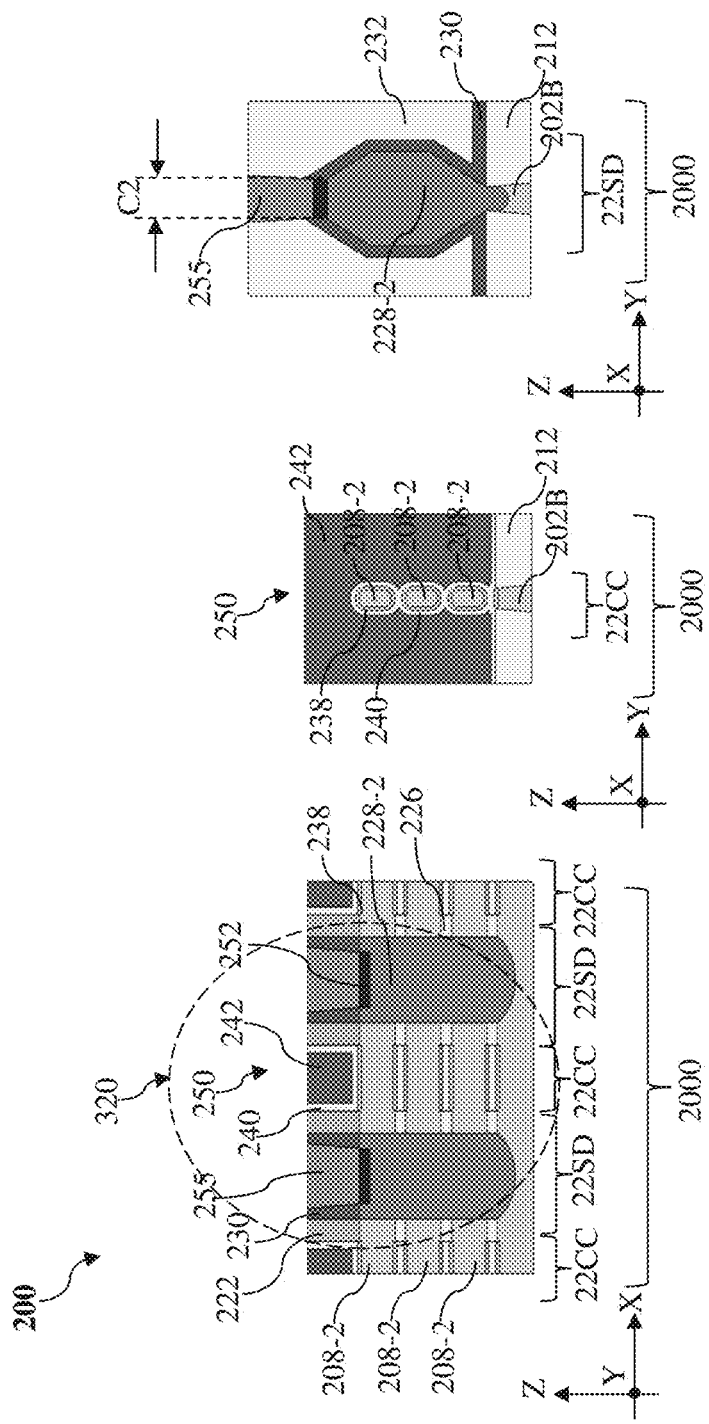

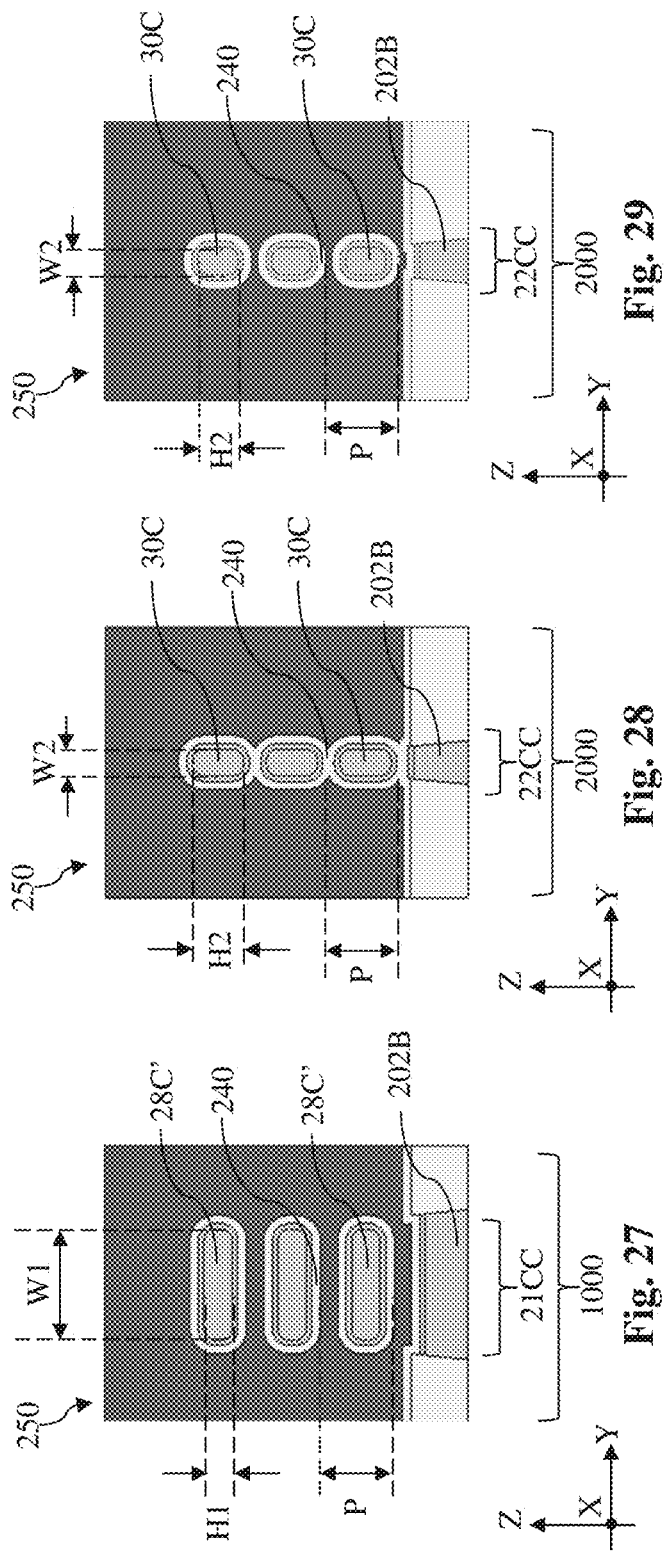

TRANSISTORS HAVING NANOSTRUCTURES

PRIORITY DATA

This application claims priority to U.S. Provisional Patent Application No. 63/013,354 filed on Apr. 21, 2020, entitled "TRANSISTORS HAVING NANOSTRUCTURES", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

A channel region of an MBC transistor may have a sheet-like shape, where the width of the channel region is greater than its height to enhance drive current of the MBC transistor. Such an MBC transistor may be suitable for high drive current application and but may not be ideal for other applications where packing density and cell size trump are more critical. Therefore, although conventional MBC transistors have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-26A, 2B-26B, and 15C-26C illustrate cross-sectional views of a workpiece during a fabrication process according to the method in FIG. 1, according to one or more aspects of the present disclosure.

FIGS. 27-29 illustrate cross-sectional views of channel members, according to one or more aspects of the present disclosure.

DETAILED DESCRIPTION

Figure 1:
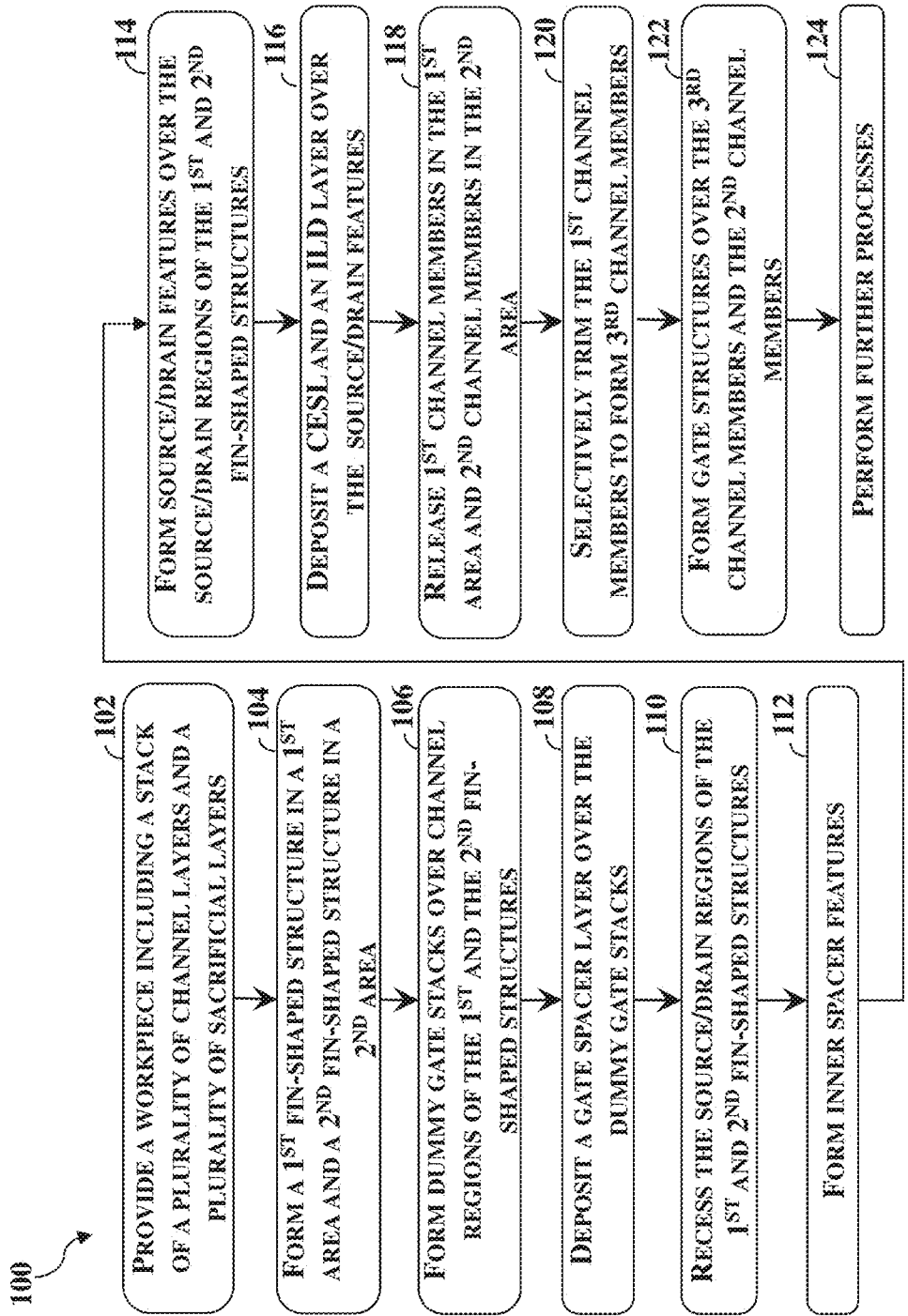
FIG. 1 collectively illustrate a flowchart of a method for forming a semiconductor device having multiple device areas, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to a semiconductor device that includes more than one type of channel members to meet different device requirements.

MBC transistors are promising candidates for next generation devices. For application where high drive current and high switching speed are required, channel members of an MBC transistor may have a sheet-like shape and such channel members may be referred to as nanosheet channel members. A nanosheet channel member has a width greater than its height for drive current enhancement. For some other applications, such as system-on-chip (SoC) and static random access memory (SRAM) applications, drive current is not the most important requirement. Instead, lower power consumption and shorter cell height is the key index. When MBC transistors with nanowire channel members are used for these latter applications, the drive current may drop considerably due to the low effective width. Here, a nanowire channel member refers to a channel member whose width is substantially identical to its height.

The present disclosure provides a semiconductor device that includes vertical nanosheet channel members in a first area and horizontal nanosheet channel members in a second area. When the first device area is for high drive current application and the second device area is for high-packing-density application, the horizontal nanosheet channel members provide increased drive current and improved speed. The vertical nanosheet channel members provides narrow footprint to increase packing density, while still allowing sufficient effective width for satisfactory driving current levels. Alternatively, the first area may be n-type device area and the second area may be p-type device area. The horizontal nanosheet channel members include primary surfaces suitable for n-type charge carriers and the vertical nanosheet channel members include primary surfaces suitable for p-type charge carriers. The present disclosure also provides example processes for forming such a semiconductor device.

The various aspects of the present disclosure will now be described in more detail with reference to the figures. In that regard, FIG. 1 is a flowchart illustrating a method 100 for fabricating a semiconductor device according to embodiments of the present disclosure. The method 100 is merely an example and is not intended to limit the present disclosure to what is explicitly illustrated in the method 100. Additional steps can be provided before, during, and after the method 100, and some steps described can be replaced, eliminated, or moved around for additional embodiments of the method. Not all steps are described herein in detail for reasons of simplicity. The method 100 is described below in conjunction with FIGS. 2A-26A, 2B-26B, and 15C-26C, which are fragmentary cross-sectional views of a workpiece at different stages of fabrication according to embodiments of the present disclosure. FIGS. 27-29 illustrate cross-sectional views of channel members in channel regions, according to various aspects of the present disclosure. A workpiece 200 is illustrated in FIGS. 2A-26A, 2B-26B, 15C-26C, and 27-29. Because a semiconductor device will be formed from the workpiece 200, the workpiece 200 may also be referred to as a semiconductor device 200 as the context requires.

Referring to FIGS. 1, 2A and 2B, the method 100 includes block 102 where a workpiece 200 is provided. FIG. 2A illustrates a fragmentary cross-sectional view of the workpiece 200 along the Y direction and FIG. 2B illustrate a fragmentary cross-sectional view along the X direction. As shown in FIGS. 2A and 2B, the workpiece 200 includes a substrate 202 and a stack 204 disposed over the substrate 202. The stack 204 includes sacrificial layers 206 and the channel layers 208 stacked vertically in an alternating configuration. Put differently, the stack 204 includes a plurality of channel layers 208 interleaved by a plurality of sacrificial layers 206. In one embodiment, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type transistors or p-type transistors). The suitable doping may include ion implantation of dopants and/or diffusion processes. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

Compositions of the sacrificial layers 206 and the channel layers 208 are different. In an embodiment, the sacrificial layers 206 may be formed of silicon germanium (SiGe) and the channel layers 208 are formed of silicon (Si). However, other semiconductor material combinations are possible, including those that provide for different oxidation rates and/or etch selectivity between the sacrificial layers and channel layers. For example, either of the sacrificial layers 206 and channel layers 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the layers of the stack 204 may be performed by a molecular beam epitaxy (MBE) process, a vapor phase epitaxy (VPE) process, a metalorganic chemical vapor deposition (MOCVD) process, and/or other suitable epitaxial growth processes. In some embodiments, the channel layers 208 may include the same material as the substrate 202. In some embodiments, the sacrificial layers 206 and channel layers 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

It is noted that three (3) layers of the sacrificial 206 and three (3) layers of the channel layers 208 are alternately arranged as illustrated in FIGS. 2A and 2B as well as in other figures, which are for illustrative purposes only and not intended to be limiting beyond what is specifically recited in the claims. It can be appreciated that any number of epitaxial layers can be formed in the epitaxial stack 204. The number of layers depends on the desired number of channels members for the device 200. In some embodiments, a number of second semiconductor layers 208 is between 2 and 8. In some embodiments, in order to form both vertical nanosheet channel members and horizontal channel members, a first thickness T1 of each of the channel layers 208 is greater than the second thickness T2 of each of the sacrificial layers 206. In some instances, a ratio of the first thickness T1 to the second thickness T2 may be between about 0.8 and about 4, such as between about 1.5 and about 4. The first thickness T1 may be between about 6 nanometers (nm) and about 16 nm and the second thickness T2 may be between about 2 nm and about 6 nm.

Referring to FIGS. 1, 3A, 3B, 4A, and 4B, the method 100 includes a block 104 where a first fin-shaped structure 210-1 is formed in a first area 1000 (or first device area 1000) of the substrate 202 and a second fin-shaped structure 210-2 is formed in a second area 2000 (or a second device area 2000) of the substrate 202. FIG. 3A illustrates a fragmentary cross-sectional view of the first area 1000 along the Y direction and FIG. 3B illustrate a fragmentary cross-sectional view of the first area 1000 along the X direction. FIG. 4A illustrates a fragmentary cross-sectional view of the second area 2000 along the Y direction and FIG. 4B illustrate a fragmentary cross-sectional view of the second area 2000 along the X direction. As shown in FIGS. 3B and 4B, the first fin-shaped structure 210-1 and the second fin-shaped structure 210-2 are formed from the stack 204 and a portion of the substrate 202. The first fin-shaped structure 210-1 has a first fin width F1 along the Y direction and the second fin-shaped structure 210-2 has a second fin width F2 along the Y direction. The second fin width F2 is smaller than the first fin width F1. In some instances, the first fin width F1 may be between about 14 nm and about 64 nm and the second fin width F2 may be between about 4 nm and about 8 nm. The smaller second fin width F2 helps reduces the footprint of transistors formed in the second area 2000, thereby increasing the packing density of transistors in the second area 2000.

While not shown, a fin-top hard mask layer may be deposited over the stack 204 and may be patterned to form an etch mask for patterning of the stack 204 and the substrate 202 into the first fin-shaped structure 210-1 and the second fin-shaped structure 210-2. The fin-top hard mask layer may be a single layer or a multilayer. In some implementations, the fin-top hard mask layer may include silicon oxide, silicon nitride, silicon oxynitride, silicon oxycarbonitride, silicon carbide, or a combination thereof. In embodiments where the fin-top hard mask layer is a multilayer, the fin-top hard mask layer may include a silicon oxide layer deposited on the stack 204 and a silicon nitride layer deposited on the silicon oxide layer. Operations at block 104 may include photolithography processes and etch processes. An example process may include photoresist coating (e.g., spin-on coating) on the fin-top hard mask layer, soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments shown in FIGS. 3B and 4B, the patterning also etches into the substrate 202 such that each of the first fin-shaped structure 210-1 and the second fin-shaped structure 210-2 includes a base portion 202B formed from the substrate 202 and an upper portion formed from the stack 204. The upper portion includes the sacrificial layers 206 and channel layers 208 of the stack 204. In some embodiments, the first fin-shaped structure 210-1 and the second fin-shaped structure 210-2 may be fabricated using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the first fin-shaped structure 210-1 and the second fin-shaped structure 210-2 by etching the stack 204 and the substrate 202. The etching process can include dry etching, wet etching, reactive ion etching (RIE), and/or other suitable processes. As shown in FIGS. 3B and 4B, the first fin-shaped structure 210-1 and the second fin-shaped structure 210-2 extend lengthwise along the X direction.

Reference is still made to FIGS. 3B and 4B. After the first fin-shaped structure 210-1 and the second fin-shaped structure 210-2 are formed in the first area 1000 and the second area 2000, respectively, an isolation feature 212 is formed between neighboring fin-shaped structures (e.g., a first fin-shaped structure 210-1 and a neighboring first fin-shaped structure 210-1 or a second fin-shaped structure 210-2 and a neighboring second fin-shaped structure 210-2). The isolation feature 212 may also be referred to as a shallow trench isolation (STI) feature 212. By way of example, in some embodiments, a dielectric layer is first deposited over the workpiece 200, filling the trenches between the first fin-shaped structures 210-1 and the second fin-shaped structures 210-2 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the STI features 212. After the recess, at least the upper portions of the first fin-shaped structures 210-1 and the second fin-shaped structures 210-2 rise above the STI features 212.

Referring still to FIGS. 1, 5A,5B, 6A, 6B, 7A, 7B, 8A, and 8B, method 100 includes a block 106 where dummy gate stacks 220 are formed over channel regions 21CC of the first fin-shaped structure 210-1 and over channel regions 22CC of the second fin-shaped structure 210-2. In some embodiments, a gate replacement process (or gate-last process) is adopted where the dummy gate stacks 220 serve as placeholders for functional gate structures and are to be removed and replaced by the functional gate structures in a subsequent process. Other processes and configuration are possible. Reference is now made to FIGS. 5A, 5B, 6A and 6B. To form dummy gate stacks 220, a dummy dielectric layer 214, a dummy gate electrode layer 216, and a gate-top hard mask 218 are sequentially deposited over the first area 1000 and the second area 2000 using a CVD process, a subatmospheric CVD (SACVD) process, a flowable CVD process, an ALD process. In some implementations, the dummy dielectric layer 214 may be formed of silicon oxide, silicon nitride, or other suitable dielectric material and functions to prevent damages to the first fin-shaped structure 210-1 and the second fin-shaped structure 210-2 during subsequent processes (e.g., formation of the dummy gate stacks). The dummy gate electrode layer 216 may be formed of polysilicon. The gate-top hard mask 218 may be a single layer or a multilayer and may include silicon oxide, silicon nitride, silicon oxynitride, silicon carbide, silicon oxycarbonitride, or a combination thereof. In instances where the gate-top hard mask 218 is a multilayer, the gate-top hard mask 218 may include a silicon oxide layer and a silicon nitride layer on the silicon oxide layer.

Reference is now made to FIGS. 7A, 7B, 8A, and 8B, after the deposition, the gate-top hard mask 218, the dummy gate electrode layer 216, and the dummy dielectric layer 214 are patterned by a patterning process that may include a lithography process (e.g., photolithography or e-beam lithography) and an etching process. The photolithography process may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. Referring to FIGS. 7A and 8A, dummy gate stacks 220 are formed over the substrate 202 and are at least partially disposed over the first fin-shaped structure 210-1 and the second fin-shaped structure 210-2. After patterning, the dummy dielectric layer 214 and the dummy gate electrode layer 216 are shaped into dummy gate stacks 220. The portions of the first fin-shaped structure 210-1 underlying the dummy gate stacks 220 are the channel regions 21CC of the first fin-shaped structure 210-1. With respect to the first fin-shaped structure 210-1 in the first area 1000, the dummy gate stacks 220 may also define source/drain regions 21SD adjacent to and on opposing sides of the channel region 21CC. As shown in FIG. 7A, each of the channel regions 21CC may be sandwiched along the X direction between two source/drain regions 21SD. Similarly, the portions of the second fin-shaped structure 210-2 underlying the dummy gate stacks 220 are the channel regions 22CC of the second fin-shaped structure 210-2. With respect to the second fin-shaped structure 210-2 in the second area 2000, the dummy gate stacks 220 may also define source/drain regions 22SD adjacent to and on opposing sides of the channel region 22CC. As shown in FIG. 8A, each of the channel regions 22CC may be sandwiched along the X direction between two source/drain regions 22SD. Because dummy gate stacks 220 are not formed over the source/drain regions 21SD of the first fin-shaped structure 210-1 or over the source/drain regions 22SD of the second fin-shaped structure 210-2, the source/drain region 21SD in FIG. 7B and the source/drain region 22SD in FIG. 8B are not disposed under a dummy gate stack 220.

Referring to FIGS. 1, 9A, 9B, 10A, and 10B, the method 100 includes a block 108 where a gate spacer layer 222 is deposited over the substrate 202, including along sidewalls of the dummy gate stacks 220. In some embodiments, spacer material for forming the gate spacer layer 222 is deposited conformally over the workpiece 200, including over top surfaces and sidewalls of the dummy gate stack 220. The term "conformally" may be used herein for ease of description of a layer having substantially uniform thickness over various regions. The gate spacer layer 222 may have a single-layer construction or include multiple layers. In some embodiments represented in FIGS. 9A and 10A, the gate spacer layer 222 includes a single-layer construction. The gate spacer layer 222 may include silicon oxide, silicon oxynitride, silicon nitride, silicon carbonitride, silicon oxycarbide, silicon oxycarbonitride, other suitable dielectric material, or a combination thereof. The spacer material may be deposited over the dummy gate stack 220 using processes such as, CVD process, a subatmospheric CVD (SACVD) process, a flowable CVD process, an ALD process, or other suitable process. The spacer material is then etched back in an anisotropic etch process to form the gate spacer layer 222. The anisotropic etch process exposes portions of the first fin-shaped structure 210-1 and the second fin-shaped structure 210-2 adjacent to and not covered by the dummy gate stack 220 (e.g., in source/drain regions 21SD in the first area 1000 or 22SD in the second area 2000). Portions of the spacer material directly above the dummy gate stack 220 may be partially or completely removed by this anisotropic etching process while the gate spacers layer 222 remain on sidewalls of the dummy gate stacks 220.

Referring to FIGS. 1, 9A, 9B, 10A, and 10B, the method 100 includes a block 110 where the source/drain regions 21SD in the first area 1000 and the source/drain regions 22SD in the second area 2000 are recessed to form source/drain trenches 224. In some implementations, the recessing is performed by etching the source/drain regions 21SD in the first area 1000 and the source/drain regions 22SD in the second area 2000 using the dummy gate stack 220 and the gate spacer layer 222 as an etch mask. The recessing may include a dry etch process that may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIGS. 9A and 10A, the upper portion of the first fin-shaped structure 210-1 and the second fin-shaped structure 210-2 are recessed to form source/drain trenches 224. The source/drain trenches 224 expose sidewalls the sacrificial layers 206 and the channel layers 208. In some implementations, at least a portion of the base portions 202B of the first fin-shaped structure 210-1 and the second fin-shaped structure 210-2 are recessed as well. That is, the source/drain trench 224 may extend into the base portions 202B in the first area 1000 and the second area 2000. The bottoms of the source/drain trenches 224 are shown in FIGS. 9B and 10B and may have a concave shape.

Referring to FIGS. 1, 11A, 11B, 12A, and 12B, method 100 includes a block 112 where inner spacer features 226 are formed. In an example process, the formation of the inner spacer features 226 includes selective and partial removal of the sacrificial layers 206 to form inner spacer recesses (not explicitly shown as they are now filled with inner spacer features 226) and formation of inner spacer features 226 in the inner spacer recesses. When the sacrificial layers 206 exposed in the source/drain trenches 224 selectively and partially recessed to form inner spacer recesses, the exposed channel layers 208 are substantially unetched. In an embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant.

The formation of the inner spacer features 226 in the inner spacer recesses include deposition of an inner spacer layer over the workpiece 200 and etch back of inner spacer layer outside of the inner spacer recesses to form the inner spacer features 226. In some embodiments, the inner spacer layers may be deposited over the workpiece 200 by CVD, PECVD, LPCVD, ALD or other suitable method. The inner spacer layer may be formed of aluminum oxide, zirconium oxide, tantalum oxide, yttrium oxide, titanium oxide, lanthanum oxide, silicon oxide, silicon carbonitride, silicon oxycarbonitride, silicon oxycarbide, low-k material, other suitable metal oxide, or a combination thereof. Subsequently, the deposited inner spacer layer may be etched back to form inner spacer features 226 in the inner spacer recesses.

Referring to FIGS. 1, 13A, 13B, 14A, and 14B, the method 100 includes a block 114 where first source/drain features 228-1 are formed in the source/drain trenches 224 in the first area 1000 and second source/drain features 228-2 are formed in the source/drain trenches 224 in the second area 2000. The first source/drain features 228-1 and the second source/drain features 228-2 may include n-type source/drain features for n-type devices and p-type epitaxial source/drain features for p-type devices. In some embodiments, both the first source/drain features 228-1 and the second source/drain features 228-2 are of the same type and may be formed simultaneously. In some other embodiments, the first source/drain features 228-1 and the second source/drain features 228-2 are of different types and may be formed separately. For example, the first source/drain features 228-1 may be n-type source/drain features and the second source/drain features 228-2 may be p-type source/drain features. The first source/drain features 228-1 and the second source/drain features 228-2 may be formed using suitable epitaxial processes, such as CVD deposition techniques (e.g., vapor-phase epitaxy (VPE), ultra-high vacuum CVD (UHV-CVD)), molecular beam epitaxy (MBE), and/or other suitable processes. In some implementations, the epitaxial growth of the first source/drain features 228-1 and the second source/drain features 228-2 may be selective to the surfaces of the channel layers 208 and the substrate 202 (or the base portions 202B). Because the first fin-shaped structure 210-1 is wider than the second fin-shaped structure 210-2 along the Y direction, the first source/drain feature 228-1 is also wider than the second source/drain feature 228-2 along the Y direction. Example n-type epitaxial source/drain features may include Si, GaAs, GaAsP, SiP, or other suitable material. The n-type epitaxial source/drain features may be in-situ doped during the epitaxial process by introducing doping species including n-type dopants, such as phosphorus (P) or arsenic (As); and/or other suitable dopants including combinations thereof. If the n-type epitaxial source/drain features are not in-situ doped, an implantation process (i.e., a junction implant process) is performed to dope the n-type epitaxial source/drain features. Example p-type epitaxial source/drain features may include Si, Ge, AlGaAs, SiGe, boron-doped SiGe, or other suitable material. The p-type epitaxial source/drain features may be in-situ doped during the epitaxial process by introducing doping species including p-type dopants, such as boron (B) or $BF_2$, and/or other suitable dopants including combinations thereof. If the p-type epitaxial source/drain features are not in-situ doped, an implantation process (i.e., a junction implant process) is performed to dope the p-type epitaxial source/drain features.

Referring to FIGS. 1, 15A, 15B, 15C, 16A, 16B, and 16C, method 100 includes a block 116 where a contact etch stop layer (CESL) 230 and an interlayer dielectric (ILD) layer 232 are formed over the first source/drain features 228-1 and the second source/drain features 228-2. FIG. 15A illustrates a fragmentary cross-sectional view of the first area 1000 along the Y direction. FIGS. 15B and 15C illustrate fragmentary cross-sectional views of the channel region 21CC and the source/drain region 21SD in the first area 1000. FIG. 16A illustrates a fragmentary cross-sectional view of the second area 2000 along the Y direction. FIGS. 16B and 16C illustrate fragmentary cross-sectional views of the channel region 22CC and the source/drain region 22SD in the second area 2000. In some embodiments, the CESL 230 is first deposited over the workpiece 200, including on the first source/drain features 228-1 in the first area 1000, the second source/drain features 228-2 in the second area 2000, and top surfaces of the isolation feature 212. In some examples, the CESL 230 may include a silicon nitride layer, a silicon oxide layer, a silicon oxynitride layer, and/or other materials known in the art. The CESL 230 may be formed by CVD or ALD. After the deposition of the CESL 230, the ILD layer 232 is deposited over the workpiece 200, including over the CESL 230. In some embodiments, the ILD layer 232 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 232 may be deposited by a PECVD process, a spin-on coating process, or other suitable deposition technique. In some embodiments, after formation of the ILD layer 232, the workpiece 200 may be annealed to improve integrity of the ILD layer 232. After the deposition and annealing of the ILD layer 232, the workpiece 200 may be planarized by, for example, a chemical mechanical polishing (CMP) process, to form a level top surface for further processing.

Referring to FIGS. 1, 17A, 17B, 17C, 18A, 18B, and 18C, method 100 includes a block 118 where first channel members 208-1 in the first area 1000 and second channel members 208-2 in the second area 2000 are released. In an example process, operations at block 118 include removal of the dummy gate stacks 220 and selective removal of the sacrificial layers 206. FIG. 17A illustrates a fragmentary cross-sectional view of the first area 1000 along the Y direction. FIGS. 17B and 17C illustrate fragmentary cross-sectional views of the channel region 21CC and the source/drain region 21SD in the first area 1000. FIG. 18A illustrates a fragmentary cross-sectional view of the second area 2000 along the Y direction. FIGS. 18B and 18C illustrate fragmentary cross-sectional views of the channel region 22CC and the source/drain region 22SD in the second area 2000. Reference is first made to FIGS. 17A, 17B, 18A, and 18B. In the depicted embodiment, a selective etch process completely removes dummy gate stacks 220 to expose sacrificial layers 206 and channel layers 208 in channel regions 21CC in the first area 1000 and channel regions 22CC in the second area 2000. As shown in FIGS. 17C and 18C, the CESL 230 and the ILD layer 232 protect the first source/drain features 228-1 and the second source/drain features 228-2 from being damaged during the operations at block 118. The etching process may be a dry etching process, a wet etching process, other suitable etching process, or combinations thereof. The etching process may be selected such that it is selective to the dummy gate stacks 220 and does not substantially etch the CESL 230, the ILD layer 232, and the gate spacer layer 222. Referring still to FIGS. 17A, 17B, 18A, and 18B, a selective etch process selectively etches the sacrificial layer 206 with minimal or no etching of the channel layers 208, the gate spacer layer 222, the ILD layer 232, and inner spacer features 226. Various etching parameters can be tuned to achieve selective etching of sacrificial layers 206, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of the sacrificial layers 206 (in the depicted embodiment, silicon germanium) at a higher rate than the material of the channel layers 208 (in the depicted embodiment, silicon). That is, the etchant in the selective etch process has a high etch selectivity with respect to the material of sacrificial layers 206. The etching process may be a dry etching process, a wet etching process, other suitable etching process, or combinations thereof. In some embodiments, a dry etching process (such as an RIE process) utilizes a fluorine-containing gas (for example, SF6) to selectively etch the sacrificial layers 206. In some embodiments, a ratio of the fluorine-containing gas to an oxygen-containing gas (for example, O2 or O3), an etching temperature, and/or an RF power may be tuned to selectively etch silicon germanium or silicon. In some embodiments, a wet etching process utilizes an etching solution that includes ammonium hydroxide (NH$_4$OH) and water (H$_2$O) to selectively etch the sacrificial layers 206. In some embodiments, a chemical vapor phase etching process using hydrochloric acid (HCl) may selectively etch the sacrificial layers 206. Upon conclusion of the operations at block 118, the channel layers 208 in the channel regions 21CC in the first area 1000 may be released from the sacrificial layers 206 to form first channel members 208-1 and the channel layers 208 in the channel regions 22CC in the second area 2000 may be released from the sacrificial layers 206 to form second channel members 208-2. Operations at block 118 form gate trenches 234 over the channel regions 21CC in the first area 1000 and channel regions 22CC in the second area 2000.

Reference is now made to FIGS. 17A and 18A. As shown in FIG. 17A, each of the first channel members 208-1 in the channel regions 21CC includes a first channel portion 28C and a first connection portion 28K. The first channel portions 28C are fully suspended over the base portion 202B and do not underlie the gate spacer layer 222. The first connection portion 28K underlie the gate spacer layer 222 and are disposed either between two inner spacer features 226 or between the gate spacer layer 222 and an inner spacer feature 226. As shown in FIG. 18A, each of the second channel members 208-2 in the channel regions 22CC includes a second channel portion 30C and a second connection portion 30K. The second channel portions 30C are fully suspended over the base portion 202B and do not underlie the gate spacer layer 222. The second connection portion 30K underlie the gate spacer layer 222 and are disposed either between two inner spacer features 226 or between the gate spacer layer 222 and an inner spacer feature 226.

Referring to FIGS. 1, 19A, 19B, 19C, 20A, 20B, and 20C, method 100 includes a block 120 where the first channel members 208-1 in the first area 1000 are trimmed to form the third channel members 208-3. FIG. 19A illustrates a fragmentary cross-sectional view of the first area 1000 along the Y direction. FIGS. 19B and 19C illustrate fragmentary cross-sectional views of the channel region 21CC and the source/drain region 21SD in the first area 1000. FIG. 20A illustrates a fragmentary cross-sectional view of the second area 2000 along the Y direction. FIGS. 20B and 20C illustrate fragmentary cross-sectional views of the channel region 22CC and the source/drain region 22SD in the second area 2000. In some embodiments, in order to selectively trim the first channel members 208-1, a photoresist mask 236 or a masking layer 236 may be formed over the second area 2000 while the first area 1000 is exposed. Formation of the photoresist mask 236 may include deposition of a photoresist material over the workpiece 200 and patterning of the photoresist material using photolithography techniques to expose the first area 1000. In some implementations, the photoresist layer may be deposited using spin-on coating or a suitable method. In some embodiments, the trimming of the first channel members 208-1 may include use of an etch process that is selective to the first channel members 208-1, which may be formed of silicon. In some other embodiments, the trimming process may include a two-step process. A first step of an example two-step process includes partial oxidation of the first channel members 208-1 to form a silicon oxide layer. A second step of the example two-step process includes selective removal of the silicon oxide layer. For example, the selective removal of the silicon oxide layer may include use of a diluted hydrofluoric acid (DHF) or buffered hydrofluoric acid (BHF). After the trimming of the first channel members 208-1, the photoresist mask 236 over the second area 2000 may be removed using a suitable process, such as ashing. At this point, the third channel members 208-3 in the first area 1000 and the second channel members 208-2 in the second area 2000 are substantially formed. As will be described further in conjunction with FIGS. 27, 28, and 29, each of the third channel members 208-3 has a width greater than its height and thus has a horizontal nanosheet orientation and each of the second channel members 208-2 has a height greater than its width and thus has a vertical nanosheet orientation.

Reference is now made to FIGS. 19A and 20A. As shown in FIG. 19A, because the third channel members 208-3 are formed from trimming of the first channel members 208-1, the first channel portion 28C in FIG. 17A is trimmed to form third channel portions 28C' while the first connection portion 28K is protected and untrimmed. That is, each of the third channel members 208-3 includes a third channel portion 28C' and the first connection portion 28K. Due to the masking of the photoresist mask 236, the second channel members 208-2 do not undergo any dimensional changes at block 120. Because the third channel members 208-3 in the first area 1000 and the second channel members 208-2 in the second area 2000 are formed from the same stack 204, a pitch of the third channel members 208-3 may be substantially equal to a pitch of the second channel members 208-2. Due to the trimming at block 120, a difference between a height of the third channel portion 28C' (along the Z direction) and a height of the first connection portion 28K (along the Z direction) may be between about 1 nm and about 8 nm. In contrast, a difference between a height of the second channel portion 30C (along the Z direction) and a height of the second connection portion 30K (along the Z direction) may be insubstantial, such as between about 0 nm and about 1 nm. Both a thickness of the first connection portion 28k and a thickness of the second connection portion 30K may be substantially identical to the first thickness T1 of the channel layer 208, which is between about 6 nm and about 16 nm.

Referring to FIGS. 1, 21A, 21B, 21C, 22A, 22B, 22C, 23A, 23B, 23C, 24A, 24B, and 24C, method 100 includes a block 122 where gate structures 250 are formed over the third channel members 208-3 in the first area 1000 and the second channel members 208-2 in the second area 2000. FIGS. 21A and 23A illustrate fragmentary cross-sectional views of the first area 1000 along the Y direction. FIGS. 21B, 23B, 21C, and 23C illustrate fragmentary cross-sectional views of the channel region 21CC and the source/drain region 21SD in the first area 1000 along the X direction. FIGS. 22A and 24A illustrate fragmentary cross-sectional views of the second area 2000 along the Y direction. FIGS. 22B, 24B, 22C, and 24C illustrate fragmentary cross-sectional views of the channel region 22CC and the source/drain region 22SD in the second area 2000 along the X direction. Each of the gate structures 250 may include an interfacial layer 238, a gate dielectric layer 240, and a gate electrode 242. Referring first to FIGS. 21A, 21B, 22A, and 22B at block 122, the interfacial layer 238 may be formed conformally on the third channel members 208-3 in the first area 1000 and on the second channel members 208-2 in the second area 2000. In some implementations, the interfacial layer 238 may include a dielectric material such as silicon oxide, hafnium silicate, or silicon oxynitride and may be formed by chemical oxidation, thermal oxidation, atomic layer deposition (ALD), chemical vapor deposition (CVD), and/or other suitable method.

Referring then to FIGS. 23A, 23B, 24A, and 24B, the gate dielectric layer 240 is then deposited over the interfacial layer 238 to wrap around the third channel members 208-3 in the first area 1000 and the second channel members 208-2 in the second area 2000. The gate dielectric layer 240 may include one or more high-k dielectric materials. High-k dielectric materials, as used and described herein, include dielectric materials having a high dielectric constant, for example, greater than that of thermal silicon oxide (~3.9). Example high-K dielectric material for the gate dielectric layer 240 may include hafnium oxide (HfO), titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. The gate dielectric layer 240 may be formed by ALD, physical vapor deposition (PVD), CVD, oxidation, and/or other suitable methods. In some instances where the second thickness T2 (shown in FIG. 2A) of the sacrificial layers 206 is between about 2 nm and about 4 nm, the gate dielectric layer 240 in the channel region 22CC in the second area 2000 may merge between neighboring second channel members 208-2, as shown in FIGS. 24A and 24B. In those instances, the merged gate dielectric layer 240 between neighboring second channel members 208-2 may prevent further layers, such as the gate electrode 242 from wrapping completely around the second channel members 208-2. In other instances where the second thickness T2 (shown in FIG. 2A) of the sacrificial layers 206 is greater than about 4 nm, the gate dielectric layer 240 in the channel region 22CC in the second area 2000 is unlikely to merge between neighboring second channel members 208-2. In those alternative instances, further layers, such as the gate electrode 242, may wrap completely around the second channel members 208-2.

Referring still to FIGS. 23A, 23B, 24A, and 24B, the gate electrode 242 is then deposited over the gate dielectric layer 240. Although not separately illustrated, the gate electrode 242 may include one or more work function layers and one or more metal fill layers. In some implementations, different work function layer stacks may be formed in n-type device regions and p-type device regions. In those implementations, while n-type device regions and p-type device regions may share certain common work function layers, n-type device regions may include one or more work function layers that are not present in the p-type device regions. Similarly, in alternative implementations, p-type device regions may include one or more work function layers that are not present in the n-type device regions. P-type work function layer includes any suitable p-type work function material, such as titanium nitride (TiN), tantalum nitride (TaN), tantalum silicon nitride (TaSiN), ruthenium (Ru), molybdenum (Mo), aluminum (Al), tungsten nitride (WN), tungsten carbonitride (WCN), zirconium silicide (ZrSi$_2$), molybdenum silicide (MoSi$_2$), tantalum silicide (TaSi$_2$), nickel silicide (NiSi$_2$), other p-type work function material, or combinations thereof. N-type work function layer includes any suitable n-type work function material, such as titanium (Ti), aluminum (Al), silver (Ag), manganese (Mn), zirconium (Zr), titanium aluminum (TiAl), titanium aluminum carbide (TiAlC), titanium aluminum silicon carbide (TiAlSiC), tantalum carbide (TaC), tantalum carbonitride (TaCN), tantalum silicon nitride (TaSiN), tantalum aluminum (TaAl), tantalum aluminum carbide (TaAlC), tantalum silicon aluminum carbide (TaSiAlC), titanium aluminum nitride (TiAlN), other n-type work function material, or combinations thereof. It is noted that p-type work function layers are not limited to use in p-type device regions and n-type work function layers are not limited to use in n-type device regions. P-type work function layers and n-type work function layers may be applied in n-type device regions and p-type device regions to achieve desired threshold voltages. In some embodiments, the gate electrode 242 may include one or more metal fill layer. For example, a CVD process or a PVD process deposits the one or more metal fill layer on n-type work function layer(s) and p-type work function layer(s), such that metal fill layer fills any remaining portion of gate trenches 234. The metal fill layer may include a suitable conductive material, such as aluminum (Al), tungsten (W), nickel (Ni), titanium (Ti), ruthenium (Ru), cobalt (Co), platinum (Pt), or copper (Cu). The metal fill layer may additionally or collectively include other metals, metal oxides, metal nitrides, other suitable materials, or combinations thereof.

In some instances where the second thickness T2 (shown in FIG. 2A) of the sacrificial layers 206 is between about 2 nm and about 4 nm, the gate dielectric layer 240 in the channel region 22CC in the second area 2000 may merge between neighboring second channel members 208-2, as shown in FIGS. 24A and 24B. In those instances, the merged gate dielectric layer 240 between neighboring second channel members 208-2 may prevent the gate electrode 242 from extending between two adjacent second channel members 208-2. As such, in those instances, the gate electrode 242 does not completely wrap around the second channel members 208-2. In other instances where the second thickness T2 (shown in FIG. 2A) of the sacrificial layers 206 is greater than about 4 nm, the gate dielectric layer 240 in the channel region 22CC in the second area 2000 is unlikely to merge between neighboring second channel members 208-2. In those alternative instances, the gate electrode 242, may extend between two adjacent second channel members 208-2 and wrap completely around the second channel members 208-2.

Referring to FIGS. 23A, 23B, 23C, 24A, 24B, and 24C, the workpiece 200 is planarized to provide a level surface. In some embodiments, the planarization is performed to remove excess interfacial layer 238, gate dielectric layer 240, and the gate electrode 242 over the workpiece 200. For example, the planarization may include a CMP process and may be performed until a top surface of ILD layer 232 is substantially planar with a top surface of the gate electrode 242.

Referring to FIGS. 1, 25A, 25B, 26A, and 26B, method 100 includes a block 124 where further processes performed. Fabrication can proceed to continue fabrication of the semiconductor device 200. For example, various contacts can be formed to facilitate operation of MBC transistors in the semiconductor device 200. For example, first source/drain contacts 254 may be formed to electrically coupled to the first source/drain features 228-1 in the first area 1000 and second source/drain contacts 255 may be formed to electrically coupled to the second source/drain features 228-2 in the second area 2000. An example process to form the first source/drain contacts 254 and the second source/drain contacts 255 may include formation of source/drain contact openings through the ILD layer 232 and the CESL 230, formation of silicide features 252, and formation of the first source/drain contacts 254 and the second source/drain contacts 255 in the source/drain contact openings. In some embodiments, the silicide features 252 may include titanium silicide (TiSi), nickel silicide (NiSi), cobalt silicide (CoSi), or titanium silicon nitride (TiSiN). The first source/drain contacts 254 and the second source/drain contacts 255 may include tungsten (W), titanium (Ti), titanium nitride (TiN), ruthenium (Ru), cobalt (Co), nickel (Ni), or copper (Cu). In order to form further interconnect structures, gate contacts, further ILD layers, further CESL layers, and additional conductive features may be formed over the workpiece 200. As described above, because the first fin-shaped structure 210-1 is wider than the second fin-shaped structure 210-2 along the Y direction, the first source/drain feature 228-1 is also wider than the second source/drain feature 228-2 along the Y direction. As a consequence, a bottom surface of a first source/drain contact 254 is wider than a bottom surface of the second source/drain contact 255 along the Y direction. As shown in FIGS. 25C and 26C, the bottom surface of the first source/drain contact 254 has a first contact width C1 along the Y direction and the bottom surface of the second source/drain contact 255 has a second contact width C2. In some instances, the first contact width C1 is greater than the second contact width C2. A ratio of the first contact width C1 to the second contact width C2 (i.e., C1/C2) may be between about 2 and about 10.

Depending on the configurations of the stack 204, the channel members of the semiconductor device 200 may have different configurations illustrated in FIGS. 27-29. Referring first to FIG. 27, each of the third channel portions 28C' (of the third channel members 208-3) in channel regions 21CC in the first area 1000 may have a first width W1 and a first height H1. The first width W1 is greater than the first height H1. For that reason, each of the third channel portions 28C' (of the third channel members 208-3) has its top and bottom surfaces as its primary channel surfaces. As the primary channel surfaces of the third channel members 208-3 extend parallel to the X-Y plane, the third channel members 208-3 may be regarded as horizontal nanosheet channel members. In some embodiments, the first width W1 is between about 10 nm and about 60 nm and the first height H1 is between about 3 nm and about 8 nm. Referring first to FIG. 28, each of the second channel portions 30C (of the second channel members 208-2) in channel regions 22CC in the first area 1000 may have a second width W2 and a second height H2. The second height H2 is greater than the second width W2. For that reason, each of the second channel members 208-2 has its sidewall surfaces as its primary channel surfaces. As the primary channel surfaces of the second channel members 208-2 extend parallel to the X-Z plane, the second channel members 208-2 may be regarded as vertical nanosheet channel members. In some embodiments, the second width W2 is between about 3 nm and about 7 nm and the second height H2 is between about 5 nm and about 15 nm. In some instances, the third channel portions 28C' (of the third channel members 208-3) is wider and shorter than the second channel portions 30C (of the second channel members 208-2). That is, the first width W1 is greater than the second width W2 and the first height H1 is smaller than the second height H2. As compared to MBC transistors having third channel members 208-3 in the first area 1000, the smaller second width W2 allows MBC transistors having second channel members 208-2 in the second area 2000 to have a smaller footprint and a higher packing density on the Z-Y plane. While its second width W2 is smaller, the greater second height H2 (as compared to the first height H1) of the second channel members 208-2 provides additional channel width for satisfactory drive current levels. It is noted that because the third channel members 208-3 and the second channel members 208-2 are formed from the same stack 204, they have the same pitch P, which may be between about 8 nm and about 18 nm.

Upon conclusion of the operations at block 124, a first transistor 310 may be formed in the first area 1000, as representatively shown in FIG. 25A and a second transistor 320 may be formed in the second area 2000, as representatively shown in FIG. 26A. Both the first transistor 310 and the second transistor 320 are MBC transistors as they include vertically stacked channel members. In some embodiments, the first transistor 310 and the second transistor 320 are for different applications. For example, the first transistor 310 has larger drive currents than the second transistor 320 and may be used for high drive current or high-speed applications. The second transistor 320 has a smaller width than the first transistor along the Y direction and may be used for high packing-density applications, such as SoC and SRAM applications. In other words, in these embodiments, the first area 1000 is a high drive current device area and the second area 2000 is a high-packing density area. In some alternative embodiments, as explained in more detail below, the first transistor 310 may be more suitable for n-type devices and the second transistor 320 may be more suitable for p-type devices in terms of charge carrier mobility. In those alternative embodiments, the first area 1000 is an n-type device area and the second area 2000 is a p-type device area.

Reference is now made to FIGS. 27-29. As shown in FIG. 27, because the third channel portions 28C' (of the third channel members 208-3) are selectively trimmed at block 120 in method 100, the gate dielectric layer 240 deposited on the third channel portions 28C' (of the third channel members 208-3) does not merge among the third channel portions 28C' (of the third channel members 208-3) and the gate structure 250, including the gate electrode 242, may wrap completely around the third channel portions 28C' (of the third channel members 208-3) in the first area 1000. The gate electrode 242 may also extend between the bottommost third channel member 208-3 and the base portion 202B in the first area 1000. The second channel portions 30C (of the second channel members 208-2) in the second area 2000 are not trimmed at block 120 of method 100 and may have a smaller inter-channel-member spacing. As shown in FIG. 28, when the second thickness T2 of the sacrificial layer 206 in the stack 204 is between about 2 nm and about 4 nm, the gate dielectric layer 240 on neighboring second channel portions 30C (of the second channel members 208-2) may merge and the gate electrode 242 may not extend between neighboring second channel portions 30C (of the second channel members 208-2) or between the bottommost second channel member 208-2 and the base portion 202B. As shown in FIG. 29, when the second thickness T2 of the sacrificial layer 206 in the stack 204 is greater than 4 nm, such as between about 4 nm and about 6 nm, the gate dielectric layer 240 on neighboring second channel portions 30C (of the second channel members 208-2) does not merge and the gate electrode 242 may extend between neighboring second channel portions 30C (of the second channel members 208-2) or between the bottommost second channel member 208-2 and the base portion 202B.

Besides providing reduced footprint while providing satisfactory channel width, the second channel members 208-2 may also be suitable for p-type devices. When the substrate 202 is a silicon substrate having <100> orientation (i.e., having its primary flat surface on the (100) crystalline plane), the primary channel surfaces of the third channel members 208-3 are on the (100) crystalline plane while the primary channel surfaces of the second channel members 208-2 are on the (110) crystalline plane. Because electron mobility is greatest on the (100) crystalline plane and hole mobility is greatest on the (110) crystalline plane, drive current may be maximized when the third channel members 208-3 are used for n-type MBC transistors and second channel members 208-2 are used for p-type MBC transistors.

In one exemplary aspect, the present disclosure is directed to a semiconductor device. The semiconductor device may include a first transistor and a second transistor. The first transistor includes a plurality of first channel members and a first gate structure wrapping around each of the plurality of first channel members. The second transistor includes a plurality of second channel members and a second gate structure disposed over the plurality of second channel members. Each of the plurality of first channel members has a first width and a first height smaller than the first width and each of the plurality of second channel members has a second width and a second height greater than the second width.

In some embodiments, a pitch of the plurality of first channel members is identical to a pitch of the plurality of second channel members. In some embodiments, the first width is greater than the second width. In some instances, the first height is smaller than the second height. In some implementations, the second gate structure includes a gate dielectric layer and a gate electrode. The gate electrode is spaced apart from the plurality of second channel members by the gate dielectric layer. The gate dielectric layer wraps around each of the plurality of second channel members, and the gate electrode does not completely wrap around each of the plurality of second channel members. In some implementations, the gate dielectric layer includes a first portion adjacent one of the plurality of second channel members and a second portion adjacent another of the plurality of second channel members and the first portion is contact with the second portion.

In another exemplary aspect, the present disclosure is directed to a semiconductor device. The semiconductor device may include a first transistor and a second transistor. The first transistor includes a first channel member over and spaced apart from a first base portion, and a first gate structure wrapping around the first channel member. The second transistor includes a second channel member over and spaced apart from a second base portion, and a second gate structure disposed over the second channel member and including an interfacial layer, a gate dielectric layer and a gate electrode. The interfacial layer is disposed on the second channel member and the second base portion. The gate dielectric layer is disposed on the interfacial layer. The gate electrode does not extend between the second channel member and the second base portion.

In some embodiments, the semiconductor device may further include a gate spacer layer disposed along sidewalls of the first gate structure and sidewalls of the second gate structure. In some embodiments, the first channel member extends lengthwise between a first source/drain feature and a second source/drain feature along a direction. The first channel member includes a channel portion directly under the first gate structure and a connection portion between the channel portion and the first source/drain feature along the direction. A height of the connection portion is greater than a height of the channel portion. In some implementations, the second channel member extends lengthwise between a first source/drain feature and a second source/drain feature along a direction, the second channel member includes a channel portion directly under the second gate structure and a connection portion between the channel portion and the first source/drain feature along the direction, and a height of the connection portion is greater than a height of the channel portion. In some instances, the second transistor further includes a third channel member disposed over the second channel member, the second gate structure is disposed over the third channel member, and the gate electrode does not extend between the second channel member and the third channel member. In some embodiments, the first channel member has a first width and a first height smaller than the first width, and the second channel member has a second width and a second height greater than the second width. In some instances, the first width is greater than the second width. In some embodiments, the first height is smaller than the second height.

In yet another exemplary aspect, the present disclosure is directed to a method. The method may include depositing, on a substrate, a stack including a plurality of channel layers interleaved by a plurality of sacrificial layers, patterning the stack and the substrate into a first fin-shaped structure and a second fin-shaped structure, forming a first dummy gate stack over a first channel region of the first fin-shaped structure and a second dummy gate stack over a second channel region of the second fin-shaped structure, forming source/drain features sandwiching the first channel region and the second channel region, removing the first dummy gate stack and the second dummy gate stack, selectively removing the sacrificial layers in the first channel region to release channel layers in the first channel region, selectively removing the sacrificial layers in the second channel region to form first channel members in the second channel region, selectively trimming the channel layers in the first channel region to form second channel members in the first channel region, forming a first gate structure over the second channel members, and forming a second gate structure over the first channel members.

In some embodiments, the first fin-shaped structure and the second fin-shaped structure extend lengthwise along a direction and a width of the first fin-shaped structure is greater than a width of the second fin-shaped structure. In some implementations, a thickness of each of the plurality of channel layers is smaller than the width of the first fin-shaped structure and the thickness of each of the plurality of channel layers is greater than the width of the second fin-shaped structure. In some embodiments, the selectively removing of the sacrificial layers in the first channel region and the selectively removing of the sacrificial layers in the second channel region are performed simultaneously and the selectively trimming of the channel layers in the first channel region includes masking the second channel region with a masking layer. In some instances, the first gate structure includes a first gate dielectric layer in contact with the second channel members and a first gate electrode spaced apart from the second channel members. The second gate structure includes a second gate dielectric layer in contact with the first channel members and a second gate electrode spaced apart from the first channel members. The first gate electrode wraps around each of the second channel members and the second gate electrode does not wrap around each of the first channel members. In some embodiments, each of the first channel members has a first height and each of the second channel members has a second height smaller than the first height.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first transistor comprising:
a plurality of first channel members extending between two first source/drain features along a first direction, and
a first gate structure wrapping around each of the plurality of first channel members; and
a second transistor comprising:
a plurality of second channel members extending between two second source/drain features along the first direction, and
a second gate structure disposed over the plurality of second channel members,
wherein each of the plurality of first channel members has a first width and a first height smaller than the first width,
wherein each of the plurality of second channel members has a second width and a second height greater than the second width,
wherein each of the two first source/drain features comprises a third width along a second direction perpendicular to the first direction,
wherein each of the two second source/drain features comprises a fourth width along the second direction,
wherein the third width is greater than the fourth width.

2. The semiconductor device of claim 1, wherein a pitch of the plurality of first channel members is identical to a pitch of the plurality of second channel members.

3. The semiconductor device of claim 1, wherein the first width is greater than the second width.

4. The semiconductor device of claim 1, wherein the first height is smaller than the second height.

5. The semiconductor device of claim 1,
wherein the second gate structure comprises a gate dielectric layer and a gate electrode,
wherein the gate electrode is spaced apart from the plurality of second channel members by the gate dielectric layer,
wherein the gate dielectric layer wraps around each of the plurality of second channel members, and
wherein the gate electrode does not completely wrap around each of the plurality of second channel members.

6. The semiconductor device of claim 5,
wherein the gate dielectric layer comprises a first portion adjacent one of the plurality of second channel members and a second portion adjacent another of the plurality of second channel members,
where the first portion is contact with the second portion.

7. A semiconductor device, comprising:
a first transistor comprising:
a first channel member over and spaced apart from a first base portion, and
a first gate structure wrapping around the first channel member; and
a second transistor comprising:
a second channel member over and spaced apart from a second base portion, and
a second gate structure disposed over the second channel member and comprising an interfacial layer, a gate dielectric layer and a gate electrode,
wherein the interfacial layer is disposed on the second channel member and the second base portion,
wherein the gate dielectric layer is disposed on the interfacial layer,
wherein the gate electrode does not extend between the second channel member and the second base portion,
wherein the first channel member has a first width and a first height smaller than the first width, and
wherein the second channel member has a second width and a second height greater than the second width.

8. The semiconductor device of claim 7, further comprising
a gate spacer layer disposed along sidewalls of the first gate structure and sidewalls of the second gate structure.

9. The semiconductor device of claim 8,
wherein the first channel member extends lengthwise between a first source/drain feature and a second source/drain feature along a direction,
wherein the first channel member includes a channel portion directly under the first gate structure and a connection portion between the channel portion and the first source/drain feature along the direction, and
wherein a height of the connection portion is greater than a height of the channel portion.

10. The semiconductor device of claim 8,
wherein the second channel member extends lengthwise between a first source/drain feature and a second source/drain feature along a direction,
wherein the second channel member includes a channel portion directly under the second gate structure and a connection portion between the channel portion and the first source/drain feature along the direction, and
wherein a height of the connection portion is greater than a height of the channel portion.

11. The semiconductor device of claim 8,
wherein the second transistor further comprises a third channel member disposed over the second channel member,
wherein the second gate structure is disposed over the third channel member,
wherein the gate electrode does not extend between the second channel member and the third channel member.

12. The semiconductor device of claim 7, wherein the first width is greater than the second width.

13. The semiconductor device of claim 7, wherein the first height is smaller than the second height.

14. A method, comprising:
depositing, on a substrate, a stack comprising a plurality of channel layers interleaved by a plurality of sacrificial layers;
patterning the stack and the substrate into a first fin-shaped structure and a second fin-shaped structure;
forming a first dummy gate stack over a first channel region of the first fin-shaped structure and a second dummy gate stack over a second channel region of the second fin-shaped structure;
forming source/drain features sandwiching the first channel region and the second channel region;
removing the first dummy gate stack and the second dummy gate stack;

selectively removing the sacrificial layers in the first channel region to release channel layers in the first channel region;

selectively removing the sacrificial layers in the second channel region to form first channel members in the second channel region;

selectively trimming the channel layers in the first channel region to form second channel members in the first channel region;

forming a first gate structure over the second channel members; and forming a second gate structure over the first channel members.

15. The method of claim 14,
wherein the first fin-shaped structure and the second fin-shaped structure extend lengthwise along a direction,
wherein a width of the first fin-shaped structure is greater than a width of the second fin-shaped structure.

16. The method of claim 15,
wherein a thickness of each of the plurality of channel layers is smaller than the width of the first fin-shaped structure,
wherein the thickness of each of the plurality of channel layers is greater than the width of the second fin-shaped structure.

17. The method of claim 14,
wherein the selectively removing of the sacrificial layers in the first channel region and the selectively removing of the sacrificial layers in the second channel region are performed simultaneously,
wherein the selectively trimming of the channel layers in the first channel region comprises masking the second channel region with a masking layer.

18. The method of claim 14,
wherein the first gate structure comprises a first gate dielectric layer in contact with the second channel members and a first gate electrode spaced apart from the second channel members,
wherein the second gate structure comprises a second gate dielectric layer in contact with the first channel members and a second gate electrode spaced apart from the first channel members,
wherein the first gate electrode wraps around each of the second channel members,
wherein the second gate electrode does not wrap around each of the first channel members.

19. The method of claim 14,
wherein each of the first channel members has a first height,
wherein each of the second channel members has a second height smaller than the first height.

20. The semiconductor device of claim 9,
wherein the first channel member extends lengthwise between a first source/drain feature and a second source/drain feature along a first direction,
wherein the second channel member extends lengthwise between a third source/drain feature and a fourth source/drain feature along the first direction,
wherein each of the first source/drain feature and the second source/drain feature comprises a third width along a second direction perpendicular to the first direction,
wherein each of the third source/drain feature and the fourth source/drain feature comprises a fourth width along the second direction,
wherein the third width is greater than the fourth width.

\* \* \* \* \*